(12) United States Patent
Jiang et al.

(10) Patent No.: US 11,923,883 B2
(45) Date of Patent: *Mar. 5, 2024

(54) METHOD AND APPARATUS TO OPTIMIZE POWER CLAMPING

(71) Applicant: pSemi Corporation, San Diego, CA (US)

(72) Inventors: Rong Jiang, San Diego, CA (US); Khushali Shah, San Diego, CA (US); Peter Bacon, Derry, NH (US)

(73) Assignee: pSemi Corporation, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/159,296

(22) Filed: Jan. 25, 2023

(65) Prior Publication Data
US 2023/0238995 A1    Jul. 27, 2023

Related U.S. Application Data

(63) Continuation of application No. 17/384,518, filed on Jul. 23, 2021, now Pat. No. 11,569,857, which is a
(Continued)

(51) Int. Cl.
*H04B 1/18* (2006.01)
*G05F 1/59* (2006.01)
(Continued)

(52) U.S. Cl.
CPC ................. *H04B 1/18* (2013.01); *G05F 1/59* (2013.01); *H03F 3/189* (2013.01); *H03G 1/0088* (2013.01); *H03G 3/3042* (2013.01); *H03H 7/24* (2013.01); *H03H 7/38* (2013.01); *H03K 5/08* (2013.01); *H03F 2200/294* (2013.01)

(58) Field of Classification Search
CPC . H03F 3/189; H03F 3/19; H03F 3/245; H03F 3/72; H03G 1/0088; H03G 11/02; H03G 2201/307; H03G 3/3036; H03G 3/3042; H03H 7/24; H03H 7/38; H03K 5/08; H04B 1/18; C12Q 1/6876; C12Q 2600/158; G01N 33/5008; G01N 33/5011; G01N 33/502; G01N 33/5088; G01N 33/68
See application file for complete search history.

(56) References Cited

U.S. PATENT DOCUMENTS 11,075,661 B1 * 7/2021 Jiang .................... H03G 3/3042
11,569,857 B2 * 1/2023 Jiang ........................ H03F 3/19
(Continued)

*Primary Examiner* — Nguyen T Vo
(74) *Attorney, Agent, or Firm* — JAQUEZ LAND GREENHAUS & McFARLAND LLP; John Land, Esq.

(57) ABSTRACT

A clamping circuit that may be used to provide efficient and effective voltage clamping in an RF front end. The clamping circuit comprises two series coupled signal path switches and a bypass switch coupled in parallel with the series coupled signal path switches. A diode is coupled from a point between the series coupled signal path switches to a reference potential. In addition, an output selection switch within an RF front end has integrated voltage clamping to more effectively clamp the output voltage from the RF front end. Additional output clamping circuits can be used at various places along a direct gain signal path, along an attenuated gain path and along a bypass path.

15 Claims, 19 Drawing Sheets

Related U.S. Application Data continuation of application No. 16/808,315, filed on Mar. 3, 2020, now Pat. No. 11,075,661.

(51) Int. Cl.
    *H03F 3/189*     (2006.01)
    *H03G 1/00*     (2006.01)
    *H03G 3/30*     (2006.01)
    *H03H 7/24*     (2006.01)
    *H03H 7/38*     (2006.01)
    *H03K 5/08*     (2006.01)

(56) References Cited

U.S. PATENT DOCUMENTS

2017/0278840 A1*   9/2017   Robbins .............. H01L 27/0292
2017/0310320 A1*  10/2017   Bottarel .................. H03K 5/08

* cited by examiner

METHOD AND APPARATUS TO OPTIMIZE POWER CLAMPING

CROSS-REFERENCE TO RELATED APPLICATIONS—CLAIM OF PRIORITY

This application is a continuation of, and claims the benefit of priority under 35 USC § 120 of, commonly assigned and co-pending prior U.S. application Ser. No. 17/384,518, filed Jul. 23, 2021, entitled "Method and Apparatus to Optimize Power Clamping", to issue on Jan. 31, 2023 as U.S. Pat. No. 11,569,857, the disclosure of which is incorporated herein by reference in its entirety. Application Ser. No. 17/384,518 is a continuation of, and claims the benefit of priority under 35 USC § 120 of, commonly assigned prior U.S. application Ser. No. 16/808,315, filed Mar. 3, 2020, entitled "Method and Apparatus to Optimize Power Clamping", issued on Jul. 27, 2021 as U.S. Pat. No. 11,075,661, the disclosure of which is incorporated herein by reference in its entirety.

BACKGROUND

(1) Technical Field

This invention relates to electronic circuits, and more particularly to power clamping circuits.

(2) Background

Radio frequency (RF) receivers are used in one-way and two-way radios, such as are found in personal electronics devices, including cellular telephones, computer tablets, and global positioning system (GPS) devices. The signals received by such RF receivers may vary considerably in strength. Consequently, protecting the circuits within such receivers by limiting the power to the input circuitry of the receiver is typically a concern. Limiting the power can avoid damage to, or prevent malfunctions in, the input circuit when a signal is applied at a power level greater than what the circuit is designed to receive.

For example, an RF receiver may be designed to receive a relatively weak signal, such as might be transmitted from a distant cellular base station transmitter. In order to receive such signals in a manner that would allow them to be used, it is necessary to have a relatively high gain, low-noise amplifier (LNA) to amplify the signals. However, in some cases, such as when an RF receiver is near an RF signal transmitter (e.g., a cell tower), the RF signal power of the received signal may be relatively high (e.g., at or above about 20 dBm). In such cases, amplification within the receiver may damage the circuits that follow the LNA. Therefore, it is useful in at least some cases to protect the input circuits from signals received at power levels that are too great for those input circuits to safely receive them.

FIG. 1 is a schematic diagram of a prior art RF receiver front end 100 having a passive bypass mode. The passive bypass mode is used to bypass an active LNA 114 that is otherwise placed in the signal path to amplify relatively weak received signals. An RF input selection switch 102 selectively couples one of four $RF_{IN}$ signal lines 103 from the input of the input selection switch 102 to either a direct gain path 104 or to an attenuated path 106. It should be noted that throughout this disclosure, reference numbers having an alphabetic character (such as the "a" and "d" in 103a, 103d, etc.) are referenced collectively by the numeric characters alone (such as 103 in this example referring to all four of the $RF_{IN}$ signal lines). Furthermore, only the reference numbers 103a and 103d are shown expressly in FIG. 1 for the sake of simplifying and reducing clutter in the figure. Nonetheless, the other two $RF_{IN}$ signal lines shown should be understood to be associated with reference symbols 103b and 103c, respectively.

Signals coupled to the direct gain path 104 are output through a first output 107 of the input selection switch 102. The first output 107 is coupled through an impedance matching inductor 110 and a DC blocking capacitor 112 to an LNA 114. An input clamping circuit 116 is coupled between the inductor 110, the capacitor 112 and a reference potential (e.g., a fixed potential, such as ground). The clamping circuit 116 comprises two diodes coupled back-to-back to maintain the input voltage to the LNA 114 within a predetermined voltage range. The output of the LNA 114 is coupled through an output attenuator 118 to a first input of an output selection switch 120 capable of selecting either the first input or a second input to be coupled to an output 134.

The attenuated path 106 couples $RF_{IN}$ signals that are output through a second output 109 of the input selection switch 102 to an input attenuator 122. The output of the attenuator 122 is coupled to an input of an attenuator path selection switch 124. The attenuator path selection switch 124 couples the input to one of two selection switch outputs. In one state, the switch 124 guides the signal through an attenuator gain path 125 that flows through the inductor 110 and the capacitor 112 to the input of the LNA 114. As noted above, the clamping circuit 116 limits the input voltage provided to the LNA 114.

A second state of the attenuator path selection switch 124 guides the signal through a bypass path 127. The illustrated bypass path includes a clamping circuit 128 having an output coupled to a bypass output attenuator 126. The clamping circuit 128 comprises a diode 130 coupled to a field effect transistor, such as a metal oxide semiconductor field effect transistor (MOSFET) 132. A clamp control signal is applied to the gate of the MOSFET 132 to either turn the MOSFET 132 ON or OFF. When the MOSFET 132 is OFF, the voltage to the input of the bypass output attenuator 126 is constrained only by the ability of the driving circuit to support the voltage swing of the signal and the breakdown voltage of the MOSFET 132. That is, even though the voltage at the anode of the diode 130 will not rise above the threshold voltage of the diode 130, the MOSFET 132 resists current flowing through it. Therefore, the voltage at the source of the MOSFET 132 will be essentially unconstrained by the diode 130. It should be further noted that when MOSFET 132 is off, the voltage swing on the bypass path will be shared by the capacitors of the MOSFET 132 and the diode 130. If the voltage swing across diode 130 exceeds diode threshold level, it will start to clamp the signal as well. However, the voltage swing required on the bypass path to trigger the diode when the MOSFET 132 is OFF is much larger than when the MOSFET 132 is ON.

However, with the MOSFET 132 turned on, the resistance through the MOSFET 132 (i.e., $R_{ON}$) is relatively small and current will flow when the voltage at the anode approaches the threshold voltage of the diode 130. The selective clamp 128 thus reduces the voltage on the bypass path 127 and thus the voltage at the RF front-end output port 134 (i.e., reduces the effective gain of the RF front-end for larger input signals by clamping the output power). Accordingly, the selective clamp 128 limits the output power of the RF receiver front end 100 to avoid damage to circuitry in later "downstream" stages. By allowing the MOSFET 132 to remove the clamping function, the linearity of the front end may be improved for cases in which the input signal will not likely exceed a safe level.

A problem for some applications is that the $R_{ON}$ of the MOSFET 132 will hamper the ability of the diode 130 to reduce the voltage at the input port of the bypass output attenuator 126, since there will be a $V_{DS}$ voltage drop between the drain and source of the MOSFET 132. In effect, the series MOSFET 132 degrades the clamping level of the diode 130.

In at least some cases, it would be desirable to improve the clamping performance of the selective clamp 128 to reduce the effective gain of the RF front-end 100 at higher input signal levels.

SUMMARY

The method and the apparatus disclosed herein provide a more efficient reduction in the effective gain of an RF front-end at higher input signal levels by increasing the efficiency of a selective clamp. In addition, several voltage clamps can be used to further improve the reduction in gain when relatively higher input signal levels are received (i.e., provide more effective clamping of the input and output signals).

In a first embodiment, a selective clamping device having a first and second terminal, the first terminal being coupled between a first and a second series-coupled switches, which may be field effect transistors (FETs). The first and second switches are coupled in series along the bypass path of an RF front-end. The second terminal of the selective clamping device is coupled to a reference potential (e.g., a fixed potential, such as ground), to clamp the voltage at the first terminal of the selective clamping device at a predetermined value. It should be noted that throughout this disclosure, the term "ground" can be either local circuit ground or system ground, depending upon the particular application of the circuit. A third switch is coupled in parallel with the series-coupled switches to provide a shunt path around the selective clamping device.

In a second embodiment, additional clamping circuits are provided at various points in the RF front-end circuit. For example, a second clamping circuit may be coupled between the input of an output select switch coupled to the LNA. A third clamping circuit may be coupled at the RF output port of the RF front-end circuit. A fourth clamping circuit may be coupled at an attenuated path output of an input selection switch.

In a third embodiment, a clamp is integrated into each of the arms of an RF output selection switch. Each arm comprises two or more switches coupled in series, with at least one pair of adjacent series switches having a clamping device coupled from the shared series node to ground. In some embodiments, a control switch is coupled between the clamping device and its associated pair of series switches to allow the clamping device to be further isolated when clamping is not in effect. In yet other embodiments, a control switch is placed in parallel with the clamping device to shunt the clamping device for greater isolation when the corresponding arm of the RF output selection switch is OFF.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The presently disclosed method and apparatus provides more effective clamping of signals within an RF front-end to enhance the reduction in peak output signal levels at high input signal levels. Throughout this disclosure, switches are shown as field effect transistors (FETs). However, it should be noted that any of the switches can be implemented using any switching device that allows control of the connection between an input and output of the switch. Furthermore, reference is made to the source and drain of the FETs. It should be noted that the designation of source and drain can be reversed without detrimental effect on the operation of the switch. Designating one side of the FET as a drain and the other as a source is done merely to aid in describing circuit connections.

Figure 2A:
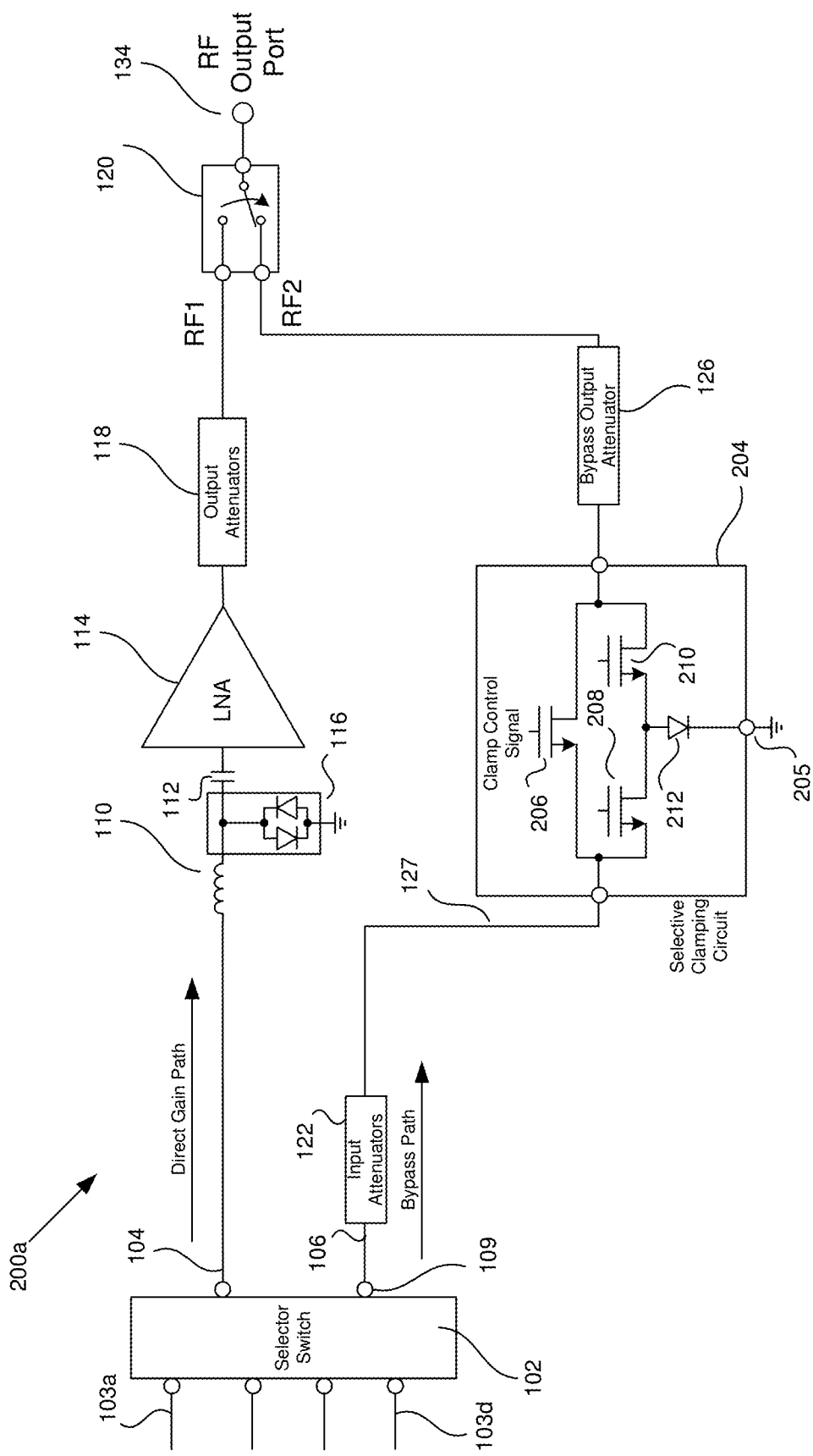
FIG. 2A and FIG. 2B are simplified schematics of the Radio Frequency (RF) front end of a radio receiver.

FIG. 2A is a simplified schematic of the Radio Frequency (RF) front end 200a of a radio receiver. An RF input selection switch 102 provides a selectable coupling between one of n input lines (in this example, n=4) and either a direct gain path 104 or a bypass path 106. When coupled to the direct gain path 104, the signal is coupled to an LNA 114 through a matching inductor 110 and a direct current (DC) blocking capacitor 112. An input clamping circuit 116 is coupled between the inductor 110, the DC blocking capacitor 112 and a reference potential (e.g., a fixed potential, such as ground). The input clamping circuit 116 is shown as a three-port device, even though two of the ports are common (i.e., shorted together) in order to generalize the configuration of the clamping circuits. Furthermore, should it be desirable to selectively clamp the input to the LNA 114, a three-port clamp, such as a clamping circuit 204 discussed in detail below may be used in place of the input clamping circuit 116. The input clamping circuit 116 includes a first clamping device, such as a single clamping diode, antiparallel diode pairs, multiple parallel diodes, MOSFETs configured as diodes, and series connected diodes for higher power & higher voltage applications. In one embodiment, in which the clamping device is an anti-parallel diode pair, a first diode has an anode coupled to the direct gain path and a cathode coupled to a reference potential (e.g., a fixed potential, such as ground). A second diode is coupled in parallel with the cathode coupled to the direct gain path and the anode coupled to the reference potential. The first diode conducts current to the reference potential when the voltage (with respect to the reference potential) at the anode of a first diode rises above the diode's threshold voltage. The second diode conducts current from the reference potential when the input voltage (with respect to the reference potential) is negative and the voltage across the second diode, anode to cathode, rises above the diode's threshold voltage. It should be noted that throughout this disclosure, the term "ground" can be either local circuit ground or system ground, depending upon the particular application of the circuit. Accordingly, the first diode resists the positive voltage from rising above the threshold of the PN junction of the diode. The second diode resists negative voltage from dropping below the negative value of the threshold voltage of the PN junction of the second diode. It should be noted that in some embodiments, the clamping circuit 116 can placed between the input selection switch 102 and the inductor 110, rather than on the amplifier side of the inductor 110. The output of the LNA 114 is coupled to the input port of an output attenuator 118. The output port of the output attenuator 118 is coupled to the input of an output selection switch 120. The output selection switch 120 selectively couples the direct gain path 104 or a bypass path to an RF output port 134 of the RF front end 200a. Accordingly, the direct gain path 104 provides a path from one of the outputs of the input selection switch 102 to the RF Output Port 134 with gain provided by the LNA 114 and attenuation provided by the output attenuator 118.

A second output 109 of the input selection switch 102 directs the input signal selected by the input selection switch 102 to a bypass path 127 coupled to an input of a clamping circuit 204. The bypass path 127 provides a passive shunt path around the LNA 114. The bypass path 127 is coupled through a clamping circuit 204. First and second signal path switches 208, 210 are coupled in series between the input and the output of the clamping circuit 204, and in parallel with a bypass switch 206.

A clamping device is coupled between the first and second signal path switches 208, 210. In one embodiment in which the clamping device is a diode 212, the anode of the diode 212 is coupled between the first signal path switch 208 and the second signal path switch 210. The cathode of the diode 212 is coupled through a reference port 205 of the clamping circuit to a reference potential (e.g., a fixed potential, such as ground). In some embodiments, the reference potential is a ground connection made through a third port of the clamping circuit 204. A clamp control signal is coupled to a control input of the bypass switch 206 (e.g., the gate of a FET used to implement the bypass switch 206) to selectively open (i.e., turn OFF) or close (i.e., turn ON) the bypass switch 206. Connections to the control inputs (e.g., the gates of FETs used to implement the switches) are not shown for the sake of simplicity and efficiency.

In a first mode (i.e., clamp mode), the clamp control signal causes the bypass switch 206 to have a relatively high impedance (i.e., the switch is OFF). In the clamp mode, the first and second signal path switches are each turned ON (i.e., the impedance through the first signal path switch 208 and the second signal path switch 210 is relatively low). Accordingly, when the clamping circuit 204 is operating in the first mode, the voltage at the anode of the diode 212 will be held (i.e., clamped) to essentially the threshold voltage of the PN junction of the diode 212 with respect to the reference voltage (i.e., ground in FIG. 2A and FIG. 2B). Accordingly, the clamping circuit 204 provides a protective voltage clamping function with respect to "downstream" circuitry.

In the second mode (i.e., clamp bypass mode), the clamp control signal causes the bypass switch 206 to have a relatively low impedance (i.e., the switch is ON). The first and second signal path switches 208, 210 are each turned OFF (i.e., the impedance through the first signal path switch 208 and the second signal path switch 210 is relatively high). Due to the relatively low impedance path through the bypass switch 206 and the relatively high impedance path through the series coupled first and second signal path switches 208, 210, the voltage at the output of the clamping circuit 204 is essentially undiminished. Accordingly, the clamping circuit 204 does not provide a voltage clamping function.

It should be noted that the connections to the control inputs (e.g., the gates of FETs used to implement switches 208, 210) are not shown for the sake of simplicity. In addition, the polarity of the signal applied to the gate bypass switch 206 generally will be inverted from the polarity of the signal applied to the control inputs of the first and second signal path switches 208, 210, since the bypass switch 206 is ON when the first and second signal path switches 208, 210 are OFF and vice versa. While in some embodiments the three switches 206, 208, 210 may be implemented by FETs, in other embodiments the switches 206, 208, 210 may be implemented by any circuit switch capable of being controlled to provide a relatively low impedance between a first port and a second port of the switch in a first state, and a relatively high impedance in a second state.

Figure 1:
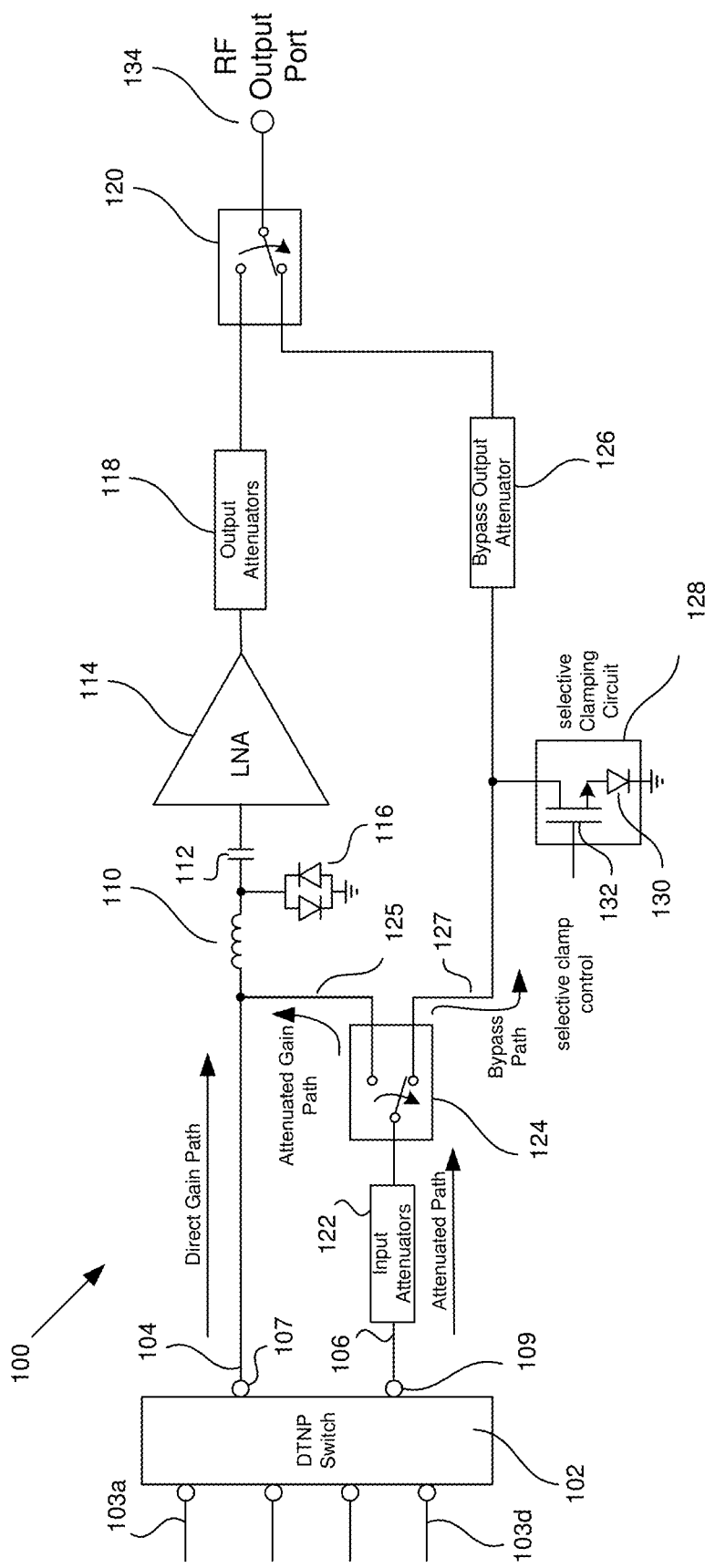
FIG. 1 is a schematic diagram of a prior art RF receiver front end having a passive bypass mode.

Looking at the clamp 128 shown in FIG. 1, it can be seen that a voltage drop $V_{dropFET}$ that occurs across the switch 132 raises the input voltage required to cause the diode 130 to conduct. This can be seen from the fact that the effective threshold voltage $V_{theff}$ of the clamp 128 is equal to the sum of the threshold voltage $V_{thD}$ of the diode 130 plus the voltage drop $V_{dropFET}$, as noted in equation EQ. 1.

$$V_{theff} = V_{thD} + V_{dropFET} \qquad \text{EQ. 1}$$

However, in the clamping circuit 204 of FIG. 2A, the input of an bypass output attenuator 126 is coupled on the diode side of the first signal path switch 208. Therefore, any voltage dropped across the first signal path switch 208 will not raise voltage at the input of the bypass output attenuator 126 above the threshold of the PN junction of the diode 212. It should be further noted that the second signal path switch 210 will further reduce the voltage presented at the input of the bypass output attenuator 126 (i.e., as opposed to raising the voltage above the voltage at the anode of the diode 212). Accordingly, the clamping circuit 204 will more effectively clamp the voltage at the input of the bypass output attenuator 126 when compared to the clamping circuit 128 shown in FIG. 1.

It should be further noted that while the clamping circuit 204 requires three switches 206, 208, 210, these three switches can be relatively small, since the maximum available clamping of the voltage is not dependent on the size of these switches. Therefore, an efficient clamping circuit 204 can be implemented that is both relatively small and which is more effective at clamping the voltage to a desired voltage level than circuits such as the circuit shown in FIG. 1.

Figure 2B:
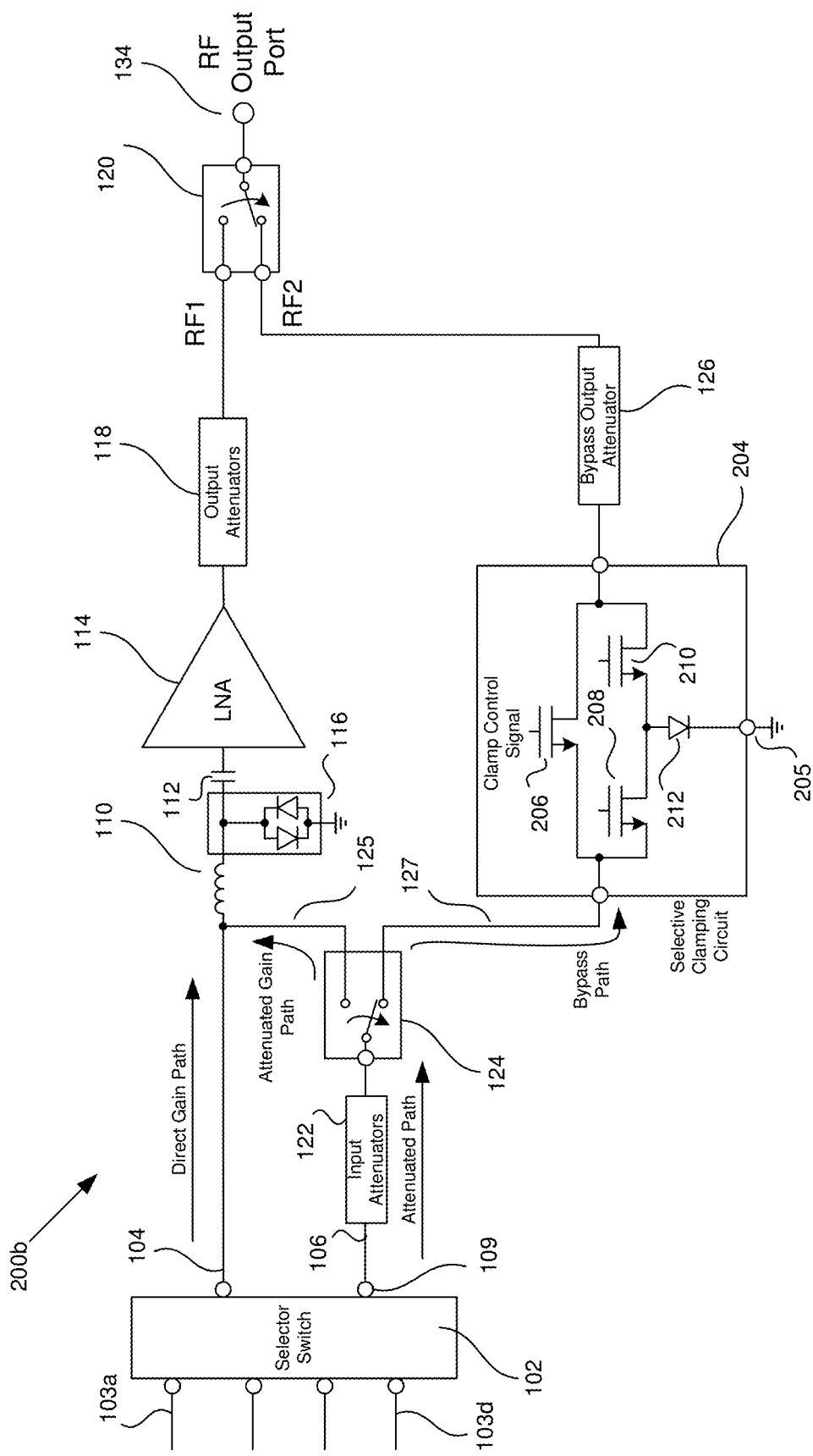

FIG. 2B is a simplified schematic of a front end 200b in which an attenuator path selection switch 124 selects whether the signal on the attenuator path 106 follows an attenuated gain path 125 or to a bypass path 127.

Figure 3:
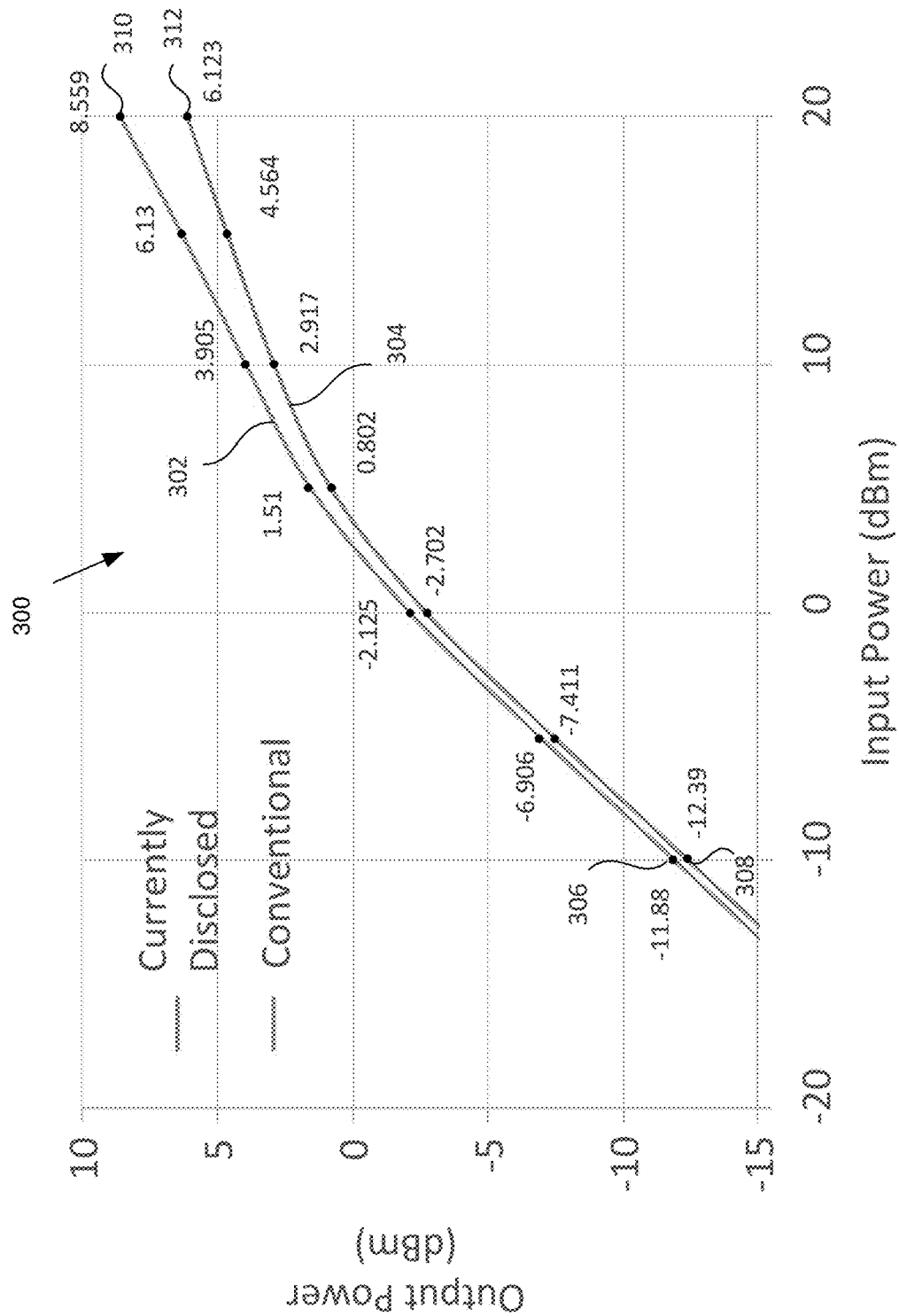
FIG. 3 is a graph showing a first curve representing the gain for a conventional front end and a second curve representing the gain of the currently disclosed front end.

FIG. 3 is a graph 300 showing a first curve 302 and its slope representing the effective gain (i.e., input power versus output power) for the conventional front end 100 of FIG. 1 and the slope of a second curve 304 representing the effective gain of the currently disclosed front end 200a, 200b of FIG. 2A and FIG. 2B, respectively. The numbers associated with each point on the two curves 302, 304 represent the output power level at that point. The first such point 306 on the first curve 302 indicates that the output power for the conventional front end 100 is −11.88 dBm with an input power level of −10 dBm. In contrast, an output power level of −12.39 dBm is shown at the first point 308 on the second curve 304 when the same input power level (i.e., −10 dBm) is applied to the front end 200, showing that the gain is higher by 0.51 dBm in the conventional front end 100. However, it should be noted that under small signal conditions (e.g., with input power levels of −10 dBm) the gain of the front end 200a, 200b could also be slightly higher than in the conventional front end 100, due to factors such as the resistance of the switches when in the ON state. However, the difference in effective gain gets greater at higher input power levels, as can be seen from the difference in the output signal level with an input of 20 dBm. At large signal conditions (e.g., 20 dBm input power), the effective gain of the conventional RF front end 100 will be substantially greater than the effective gain of RF front end 200. The output power for the conventional front end 100 is 8.559 dBm at point 310 with an input power level of 20 dBm. In contrast, an output power level of 6.123 dBm is shown at the point 312 on the second curve 304 when the same input power level (i.e., 20 dBm) is applied to the front end 200, showing that the gain is 2.44 dB higher in the conventional front end 200. Therefore, it can be seen that the clamping of the output is more effective in the currently disclosed front end 200a, 200b shown in FIG. 2A and FIG. 2B than in the front end 100 shown in FIG. 1. The small signal (input power level of −10 dBm) impact to insertion loss is only 0.51 dB, while the large signal (input power level of 20 dBm) benefit is 2.44 dB of improved clamping.

Figure 4:
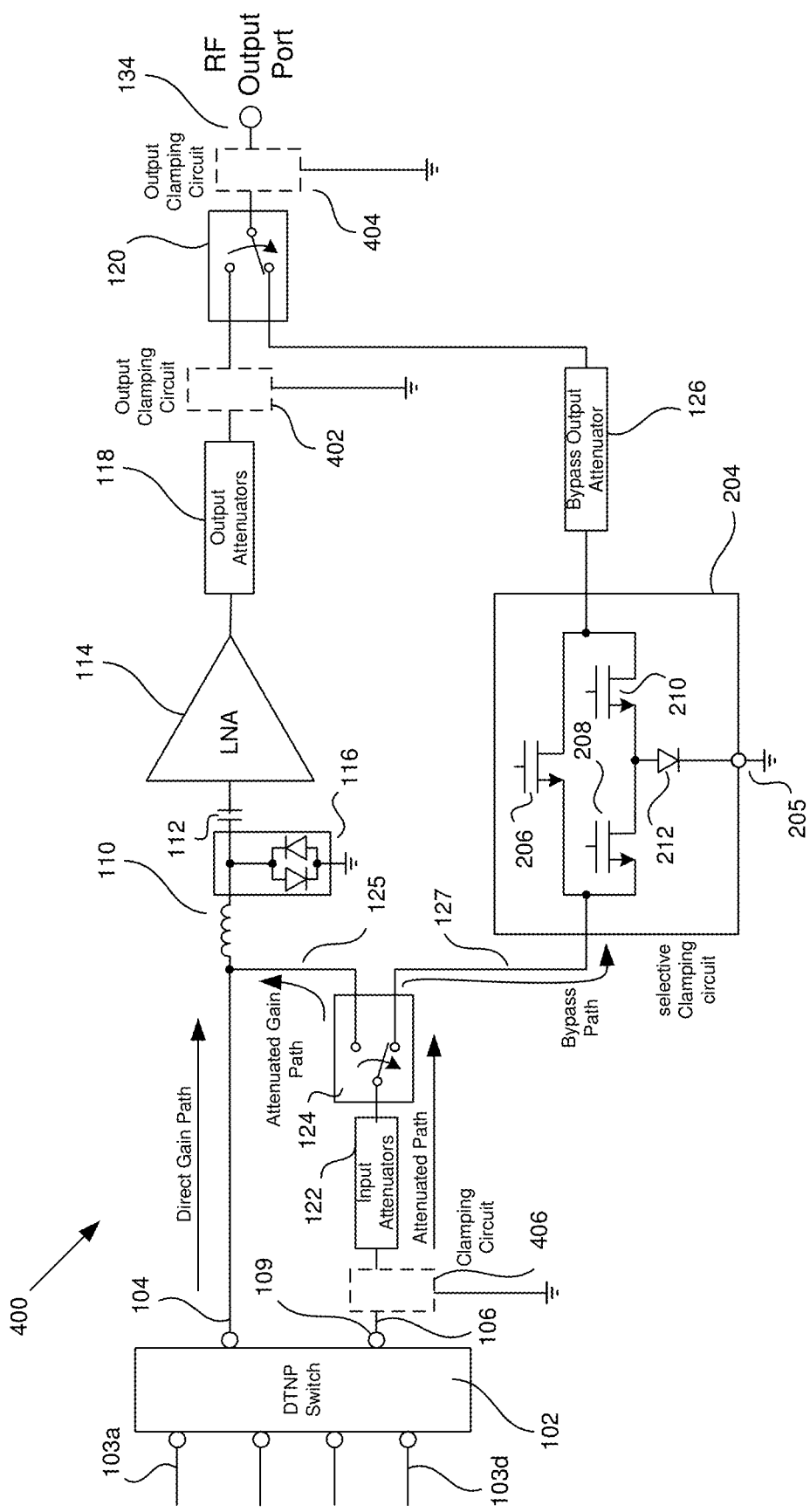
FIG. 4 is a simplified schematic of another embodiment of the disclosed RF front end.

FIG. 4 is a simplified schematic of another embodiment 400 of the disclosed RF front end. The RF front end 400 is essentially the same as the RF front end 200a and 200b of FIG. 2A and FIG. 2B, however, with several optional clamping circuits 402, 404, 406 placed as shown (noted in dotted outline to indicate that each is optional).

For example, in accordance one embodiment, an output clamping circuit 402 is coupled to the gain path after the output attenuator 118 and before the output selection switch 120. By placing this second clamping circuit 402 before the output selection switch 120, the output power can be even more effectively clamped when the front end 400 is operating in direct gain mode (i.e., the signal is being amplified by the amplifier 114). The second output clamping circuit 402 can be similar in design to the clamping circuit 204 shown in FIG. 2A and FIG. 2B. Alternatively, the second output clamping circuit 402 can be designed similar to the clamping circuit 128 shown in FIG. 1, in which a switch 132 and a clamping diode 130 are coupled in series to ground and thus clamping the output of the LNA 114.

In accordance with another embodiment, a third output clamping circuit 404 is placed at the output of the output selection switch 120. By placing the third output clamping circuit 404 after the output selection switch 120, the clamp on the output power can be improved in both active gain mode and bypass mode, improving the clamping in the active gain mode even more than with the second output clamping circuit 402 alone. The third output clamping circuit 404 can be similar in design to the clamping circuit 204. Alternatively, the third output clamping circuit 404 can be designed like the clamping circuit 128 shown in FIG. 1, in which a switch 132 and a clamping diode 130 are coupled in series to ground to clamp the output.

In other embodiments, another clamping circuit 406 is placed in the attenuated path 106 (i.e., at the second output 109 of the input selection switch 102). By placing a clamping circuit 406 on the attenuated path 106 after the input selection switch 102, the output power can be even more effectively clamped than is possible with the embodiment in which three such clamping circuits are provided. The clamping circuit 406 at the output of the selection switch 102 can be similar in design to the clamping circuit 204. Alternatively, the clamping circuit 406 can be designed similar to the clamping circuit 128 shown in FIG. 1.

Accordingly, embodiments may include only the one clamping circuit 204 shown in FIG. 2A and FIG. 2B, or one or more of the additional clamping circuits shown in FIG. 4.

Figure 5:
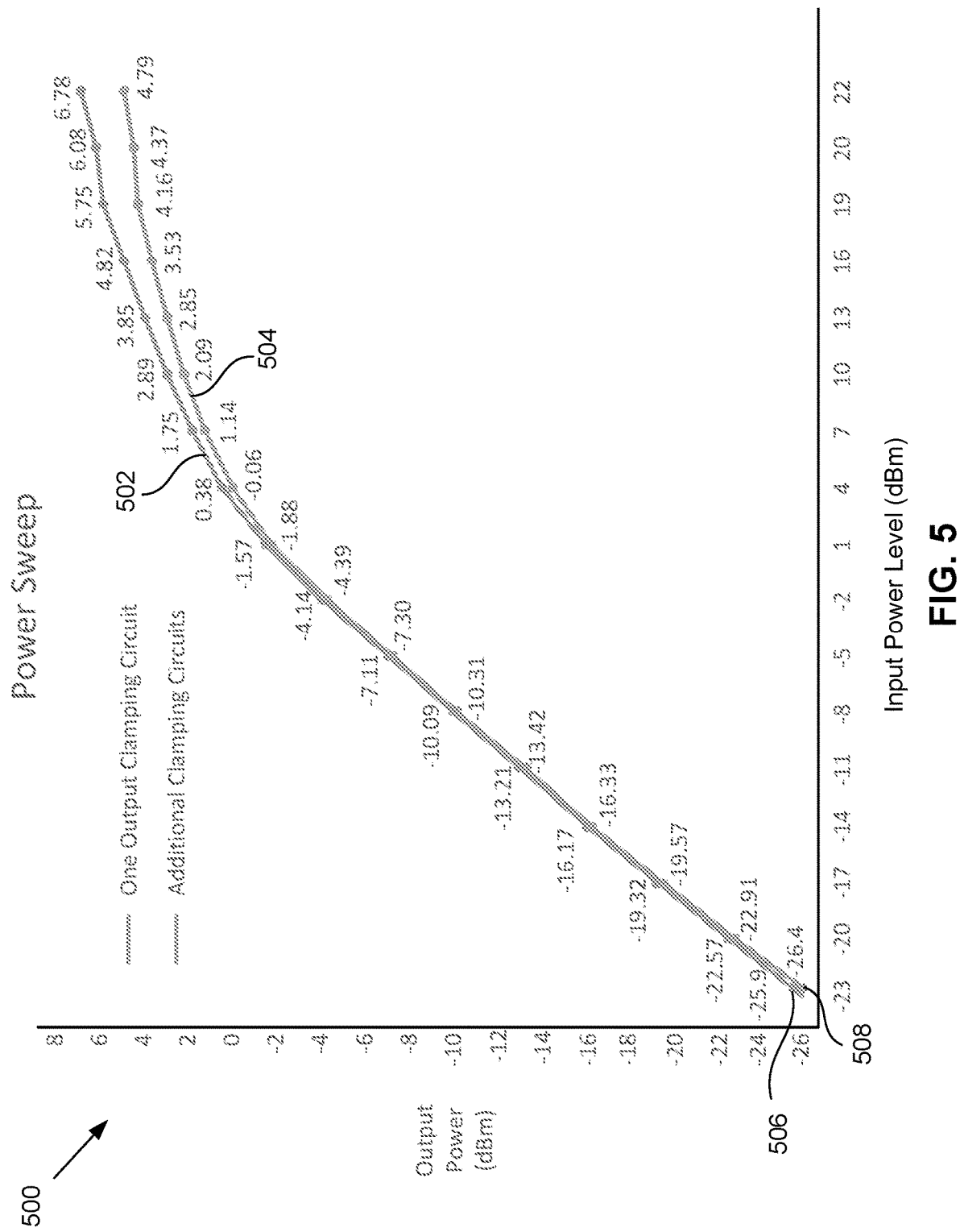
FIG. 5 is a graph that compares an RF front end having one clamping circuit with an RF front end having additional clamping circuits.

FIG. 5 is a graph 500 comparing the gain (shown in first curve 502) provided by an RF front end 200 with a clamping circuit 204 to the gain (shown in a second curve 504) of an RF front end 400 having an additional clamping circuit 404. Numbers associated with each point on the two curves 502, 504 represent the output power level at the corresponding input power level. The first such point 506 on the first curve 502 indicates that the output power for the front end 200 is −25.9 dBm with an input power level of −23 dBm. The output power level of the front end 400 is −26.4 dBm at the point 508 on the second curve 504 with the same input power (i.e., −23 dBm) applied. The front ends 200, 400 perform in essentially linear fashion at input levels ranging from −23 dBm to 1 dBm (i.e., the effective gain remains essentially constant). However, with approximately 4 dBm applied to each front end 200, 400, the curves each start to flatten out (i.e., clamping begins). Accordingly, it can be seen that the clamping that occurs in the front end 400 (curve 504), causes the effective gain to flatten out faster than in the front end 200 (curve 502), indicating a more effective clamping of the output power in the front end 400. When the input power level reaches 22 dBm, the output power of the front end 200 is 6.78 dBm, however the output power of the front end 400 is only 4.79 dBm (i.e., nearly 2 dB less).

RF Signal Selection Switch with Integrated Clamps

FIG. 6 through FIG. 15 are simplified schematics of alternative switch configurations that can be used to implement the output selection switch 120 and the attenuator path selection switch 124 of the front end 200 shown in FIG. 2A, FIG. 2B and FIG. 4. These architectures may be used to implement any single pole/n-throw switch.

Figure 6:
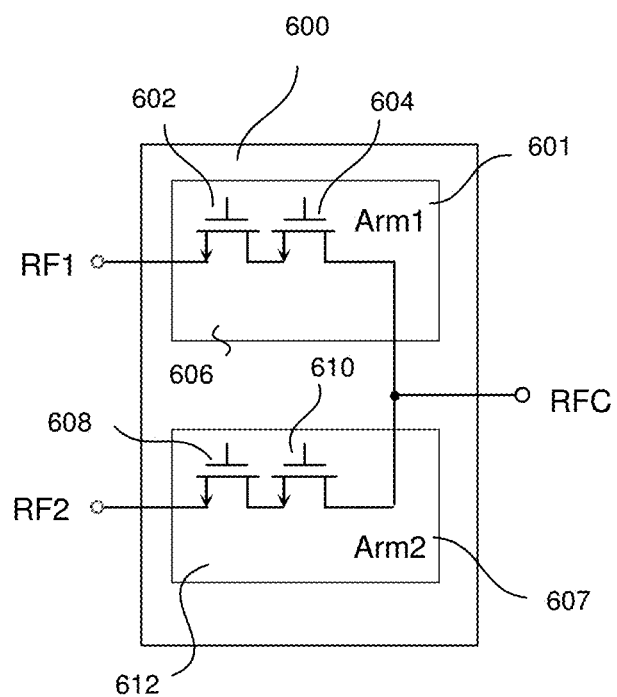
FIG. 6 is a simplified schematic of one embodiment of a signal selection switch having a first arm (Arm1) and a second arm (Arm2).

FIG. 6 is a simplified schematic of one embodiment of a signal selection switch 600. The selection switch 600 has a first arm 601 comprising a pair of series switches 602, 604 coupled between an RF1 input and a common RF (RFC) output. In some embodiments, the series switches 602, 604 are FETs, as shown in FIG. 6. A second arm 607 is configured in similar fashion to that of the first arm 601. However, the series switches 608, 610 of the second arm 607 are coupled between a second input (RF2) and the RFC output of the signal selection switch 600.

The control inputs (e.g., gates, for FETs) of each of the four switches 602, 604, 608, 610 within the selector switch 600 are coupled to a control signal that determines whether the first arm 601 or the second arm 607 is coupled to the RFC output. When the series switches 602, 604 of the first arm 601 are ON, the series switches 608, 610 of the second arm 607 are OFF. Accordingly, signals applied to the RF1 input of the selector switch 600 are coupled to the RFC output and signals applied to the RF2 input are isolated from the RFC output. That is, there is a low impedance path through the series switches of the first arm 601, coupling the first input RF1 to the RFC output. In contrast, the series switches 608, 610 of the second arm 607 impose a high impedance to signals from the second input RF2 to the RFC output.

When the states of each of the four switches of the selector switch 120 are reversed (switches that are ON are turned OFF and switches that are OFF are turned ON) by control signals coupled to the control inputs of each (not shown), signals coupled to the first arm 601 are isolated from the RFC output and signals coupled to the RF2 input are connected to the RFC output. That is, signals at the second input RF2 are coupled through a low impedance path to the RFC output and the first input RF1 is isolated from the RFC output by a high impedance path to the RFC output.

Figure 7:
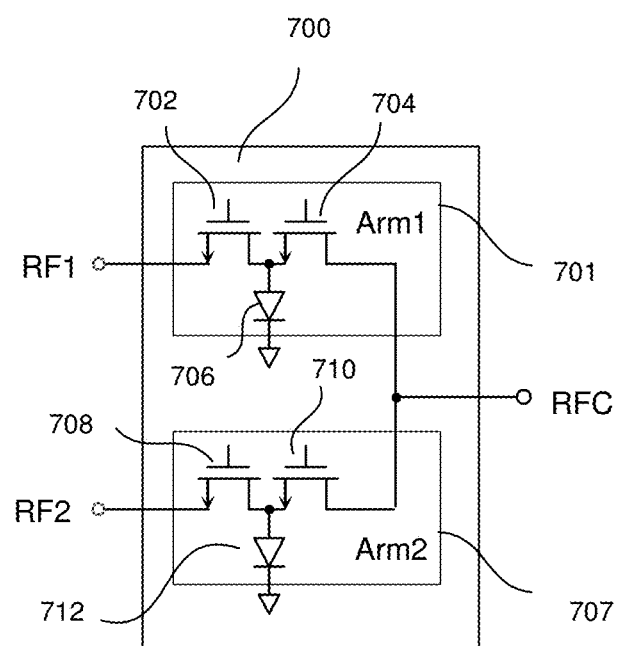
FIG. 7 is a simplified schematic of a switch in which each arm includes an integrated clamp.

FIG. 7 is a simplified schematic of a signal selection switch 700 in which each arm includes an integrated clamp. The first arm 701 has a pair of series switches (e.g., FETs in some embodiments, as shown in FIG. 7) 702, 704 coupled in between the RF input port RF1 and the RFC output. A clamping device, such as a diode 706, is used to clamp the voltage at a node between the pair of series coupled switches 702, 704 to a reference potential (e.g., a fixed potential, such as ground). The clamping device may be a single clamping diode, such as the diode 706 shown, anti-parallel diode pairs, multiple parallel diodes, MOSFETs configured as diodes, and series connected diodes (i.e., for higher power & higher voltage applications). In one embodiment, the anode of a diode 706 is coupled to a node between the internal switches 702, 704 and the cathode is coupled to a reference potential (e.g., a fixed potential, such as ground). In other embodiments, the cathode of the diode 706 is coupled to a potential other than ground. Similarly, the second arm 707 has a pair of series switches 708, 710 coupled in between the RF input port RF2 and the RFC output. A diode 712 is coupled from a node between the internal switches 708, 710 to the reference potential. By coupling the cathode of the diodes 706, 712 to a reference potential other than ground, the voltage at which the anode is clamped can be set to that voltage plus the threshold voltage of the diode 706, 712. In embodiments in which the clamping device is a diode, it should be noted that one or both diodes 706, 712 can be reversed so that the anode is coupled to the reference potential, depending on the relative voltages at the reference potential and the voltages that are anticipated to be applied to the RF1 and RF2 inputs.

The signals to be output from the switch 700 are controlled by control signals applied to the control inputs (e.g., gates for FETs) of the four series switches 702, 704, 708, 710. The source of such control signals is not shown for the sake of simplicity and efficiency. In one embodiment, when the signal selection switch 700 is in a first state, a control signal applied to the control inputs of the series switches 702, 704 of the first arm 701 turns ON the series switches 702, 704. A control signal applied to the control inputs of the series switches 708, 710 in the second arm 707 turns OFF the series switches 708, 710. In this state, a signal applied to the first input RF1 of the signal selection switch 700 is clamped essentially at the voltage to which the cathode of the diode 706 is coupled, plus the threshold voltage of the diode 706. That is, taking the case in which the switches 702, 704 are implemented using FETs and the cathode of the diode 706 is coupled to ground, as shown in FIG. 7: the voltage at the RFC output of the signal selection switch 700 will be equal to the threshold voltage of the diode 706, minus a small voltage drop that will occur between the source and drain of the second FET 704. That voltage will be determined by $R_{ON}$ (the "on" resistance) of the FET 704 times the current that flows through MOSFET switch 704 to the RFC output of the signal selection switch 700. The other two series switches 708, 710 are OFF (e.g., will exhibit a relatively high impedance from drain to source in the case in which the switches 708, 710 are FETs). Therefore, any signal applied to the second input RF2 of the signal selection switch 700 will be essentially isolated from the RFC output of the signal selection switch 700.

In a second signal selection switch state, a control signal applied to the control inputs of the series switches 702, 704 of the first arm 701 turns OFF the series switches 702, 704. The control signal applied to the control inputs of the series switches 708, 710 of the second arm 707 turns ON the series switches 708, 710 of the second arm 707. Accordingly, in embodiments, in which the switches are FETs, signals applied to the second input RF2 of the signal selection switch 700 are clamped to essentially the threshold voltage of the diode 712 minus a small drop that occurs between the source and drain of the FET 710.

Notably, by incorporating a clamp function into the architecture of the signal selection switch 700 in addition to the clamping provided by other clamping circuits, such as the selective clamping circuit 204 shown in FIG. 2A and FIG. 2B, a more effective clamp is provided. As should be clear, the concept applies to signal selection switches having more than two arms.

Figure 8:
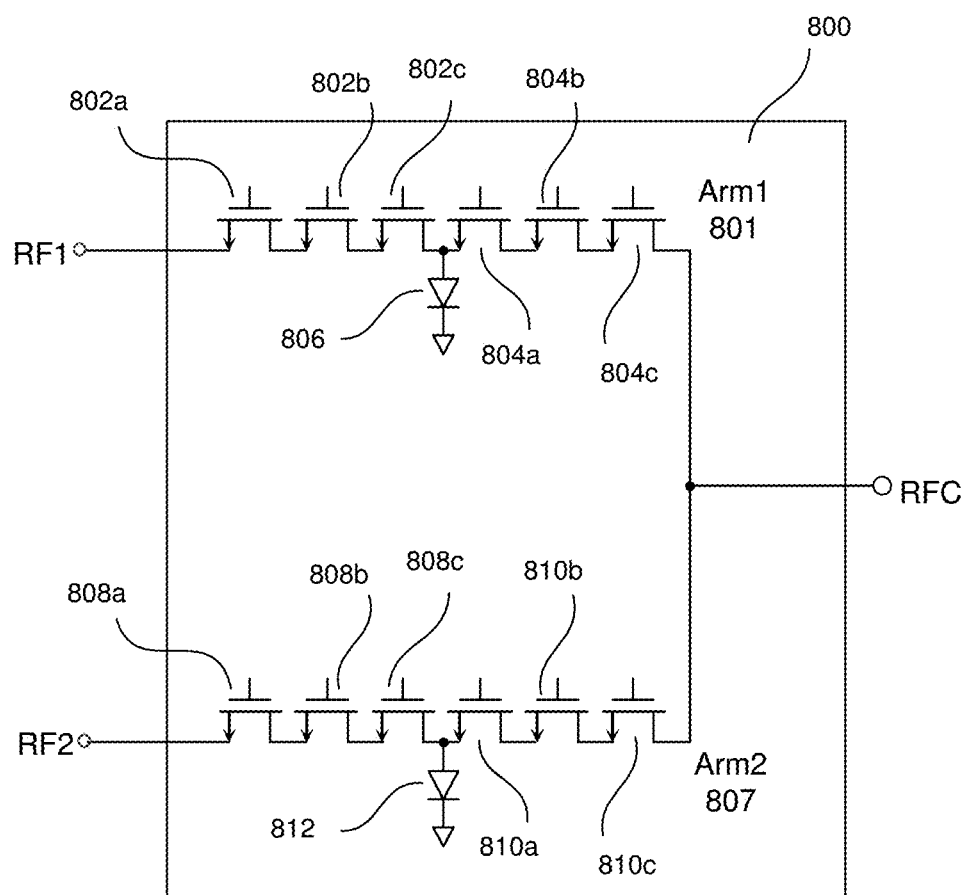
FIG. 8 is a simplified schematic of a signal selection switch that is similar to the signal selection switch of FIG. 7.

FIG. 8 is a simplified schematic of a signal selection switch 800 that is similar to the signal selection switch 700 of FIG. 7. However, one or more arms of the signal selection switch 800 of FIG. 8 have several FETs 802, 804 coupled in series which provide for greater voltage handling capability for the signal selection switch 800. While all of the switches throughout this disclosure are shown and discussed as being implemented as FETs, any one or all may be implemented by any other structure for selectively connecting and disconnecting the nodes of the switch. The anode of a diode 806 is coupled from a node between a pair of adjacent series-coupled switches to a reference potential (e.g., a fixed potential, such as ground). In FIG. 8, three FETs 802 are shown coupled between the anode of the diode 806 and the first input RF1 of the signal selection switch 800. Similarly, there are three FETs 804 coupled between the anode of the diode 806 and the RFC output of the signal selection switch 800, three FETs 806 coupled between the anode of the diode 812 and the second input RF2 of the signal selection switch 800, and three FETs 810 coupled between the anode of the diode 812 and the RFC output of the signal selection switch 800. While three FETs are shown for each side of the diodes 806, 812, the particular number of FETs is not limited to three (i.e., may be either greater or less than three). Furthermore, the number FETs 802, 808 that are present between the switch inputs RF1, RF2 and the respective diode 806, 812 in each arm need not be the same as the number of FETs 804, 810 present between the RFC output and the diodes. Similarly, the number of FETs 802, 804 need not be the same as the number of FETs 808, 810. Likewise, the number of FETs 802, 804, 808, and 810 need not be the same and may all be of different value.

The signal selection switch 800 has a first state in which all of the FETs 802, 804 in the first arm 801 are turned ON and at least some of the FETs 808, 810 in the second arm 807 are turned OFF. In the first state, a signal coupled to the first input RF1 is clamped at the RFC output of the signal selection switch 800 by diode 806. Signals presented to the second input RF2 are isolated from the RFC output of the signal selection switch 800.

In a second state, all of the FETs 808, 810 in the second arm 807 are turned ON and at least some of the FETs 802, 804 in the first arm 801 are turned OFF. Accordingly, signals presented to the first input RF1 are isolated from the RFC output and signals presented at the second input RF2 are clamped at the RFC output of the signal selection switch 800 by diode 812.

Figure 9:
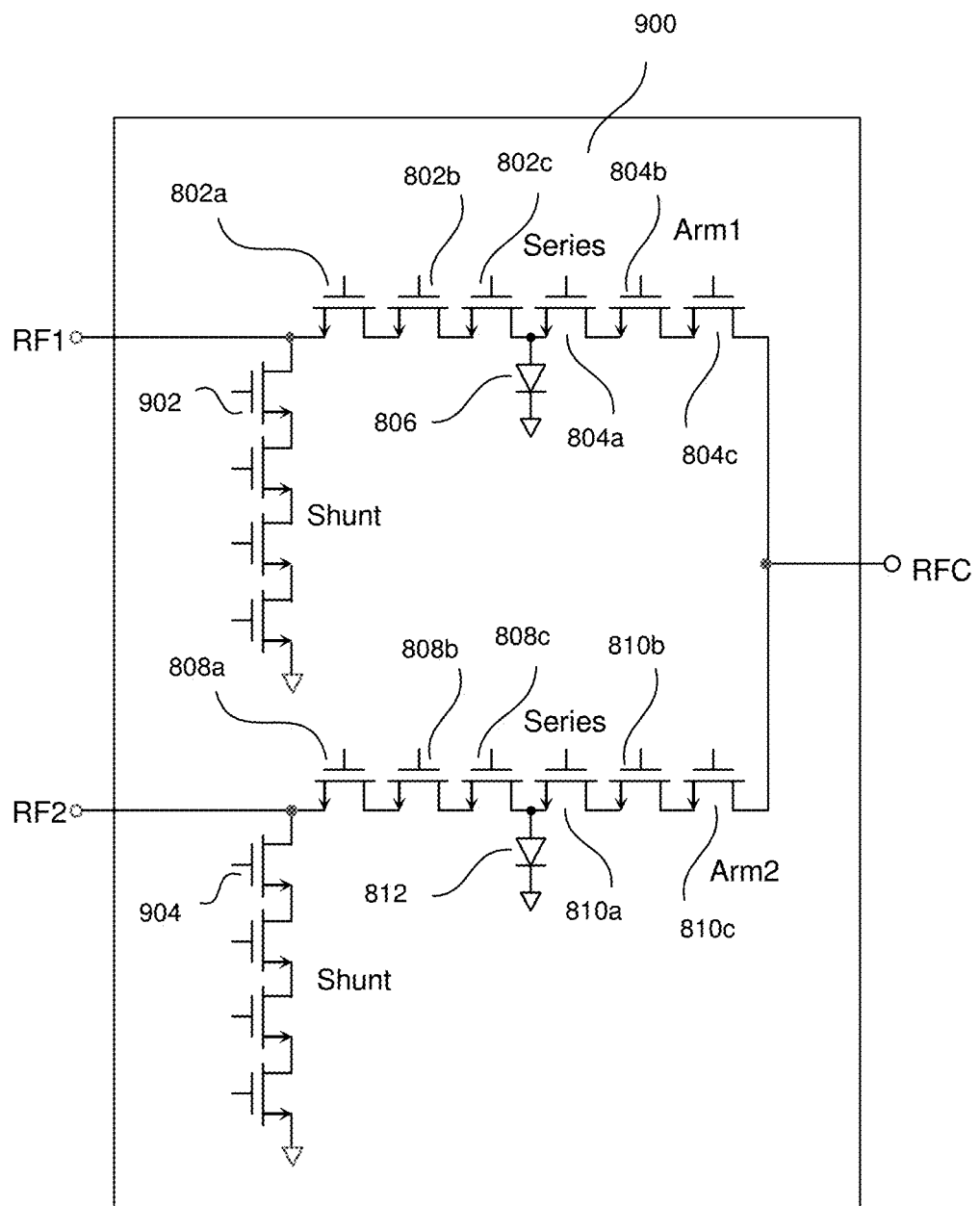
FIG. 9 is another architecture that may be used to implement the signal selection switch.

FIG. 9 is another architecture 900 that may be used to implement the signal selection switch 120. The signal selection switch 900 is essentially the same as the signal selection switch 800 shown in FIG. 8. However, additional "shunt" FETs 902, 904 are provided between the inputs RF1, RF2, respectively, and to provide a low impedance to a reference potential (e.g., a fixed potential, such as ground) in order to provide greater isolation for a deactivated arm. In addition, the shunt FETs 902, 904 may be used to provide a better port impedance for the deactivated arm. Four series-coupled FETs 902, 904 are shown coupled between a respective one of the two inputs RF1, RF2 and a reference potential (e.g., a fixed potential, such as ground). Nonetheless, any number of FETs 902, 904 may be provided, with the number generally determined by a desired voltage handling capability across the shunt stack. Also, although the placement of the shunt FETs 902, 904 are shown directly at the RF1 and RF2 ports, they may be placed at nodes closer to the RFC port. One skilled in the art would recognize the potential increase in isolation levels for the OFF state versus a small impact on the associated insertion loss for the ON state.

In a first state, the FETs 802, 804 in the first arm 601 are turned ON and the corresponding shunt FETs 902 are turned OFF by signals applied to the gates of each FET 802, 804, 902. The FETs 808, 810 of the second arm 607 are turned OFF and the shunt FETs 904 coupled to the second input RF2 are turned ON by signals applied to the gates of each FET 808, 810, 904. The signals are not shown for the sake of brevity and efficiency.

In the second state, the FETs 802, 804 in the first arm 601 are turned OFF and the shunt FETs 902 are turned ON by signals applied to the gates of each FET 802, 804, 902. The FETs 808, 810 of the second arm 607 are turned ON and the shunt FETs 904 coupled to the second input RF2 are turned OFF by signals applied to the gates of each FET 808, 810, 904.

Figure 10:
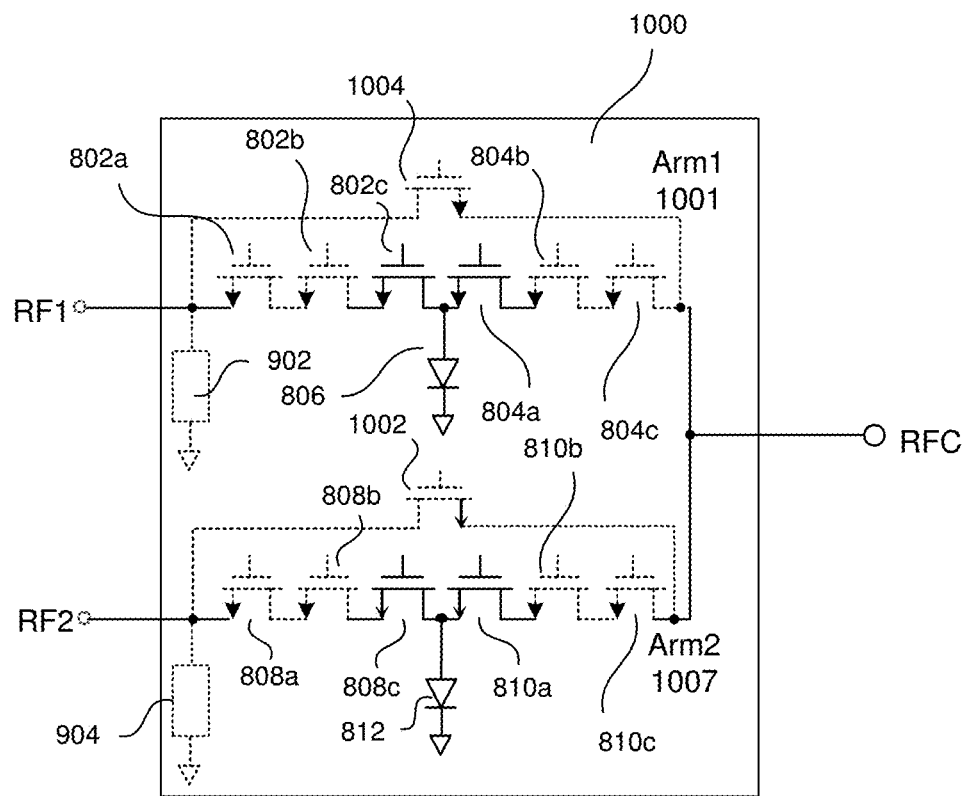
FIG. 10 is a simplified schematic of another embodiment that can be used to implement the signal selection switch.

FIG. 10 is a simplified schematic of another embodiment 1000 that can be used to implement the signal selection switch 120. The signal selection switch 1000 operates essentially like the signal selection switch 900 shown in FIG. 9. However, a bypass FET 1002 is coupled in parallel with the FETs 808, 810 of the second arm 1007 of the signal selection switch 1000. It should be noted that, in this specific embodiment, the second input RF2 is coupled to the bypass path which has no amplification. Therefore, in some embodiments, it might be desired to be able to bypass the clamping function provided by the diode 812. In some embodiments, a similar bypass FET 1004 can be placed in parallel with the FETs 802, 804 of the first arm 1001 of the signal selection switch 1000. The bypass FETs 1002, 1004 are shown in dotted line to indicate that the FETs 1002, 1004 are each optional. That is, it may be desirable to be able to bypass one or more of the diode clamps provided within the signal selection switch 1000. In some cases, it may be desirable to bypass the clamp in only one leg, such as the leg in which an LNA 114 is present in the signal path. Nonetheless, there might be applications for which such a bypass is desired in both paths. In addition, shunt FETs 902, 904, similar to those shown in FIG. 9, may be coupled to the first and second inputs RF1, RF2. Such shunt FETs 902, 904 are shown in dotted line to indicate that they are optional. In some embodiments, when the shunt FETs 902, 904 are turned ON, the LNA 114 is turned OFF. It should be noted that the control input to turn the LNA 114 ON and OFF is not shown for simplicity and efficiency in the figures.

Figure 11:
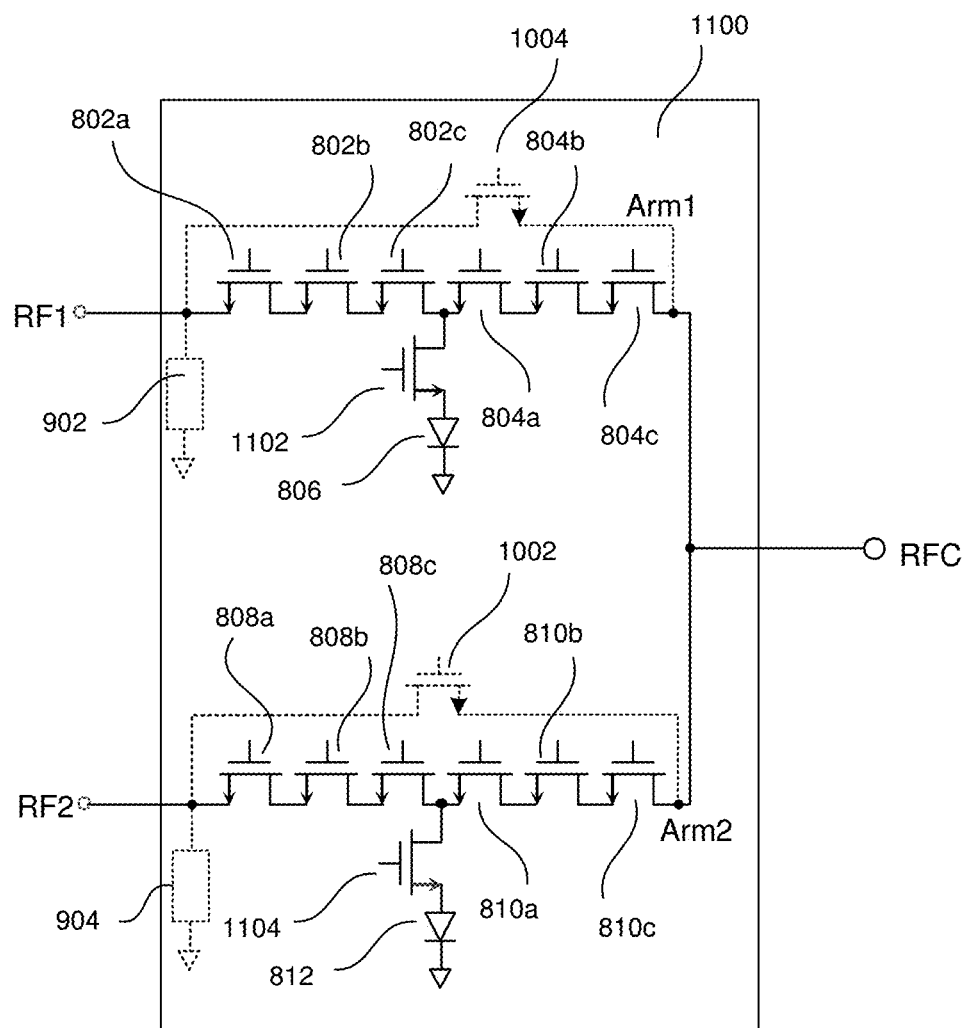
FIG. 11 is a simplified schematic of another embodiment that can be used to implement the signal selection switch.

FIG. 11 is a simplified schematic of another embodiment 1100 that can be used to implement the signal selection switch 120. The signal selection switch 1100 operates essentially the same as the signal selection switch 1000 described with respect to FIG. 10. However, the signal selection switch 1100 has a first FET 1102 coupled to the anode of the diode 806 and a second FET 1104 coupled to the anode of the diode 812. The FETs 1102, 1104 are switched OFF when the associated arm is OFF to provide additional isolation for the respective diodes 806, 812. When the associated arm is ON, FET 1102 and FET 1104 can be selectively turned ON or OFF to enable or disable the associated clamping device. As in FIG. 10, any combination of one or more input shunt FET switch stacks 902, 904 and/or bypass FETs 1002, 1004 may be provided in some embodiments.

Figure 12:
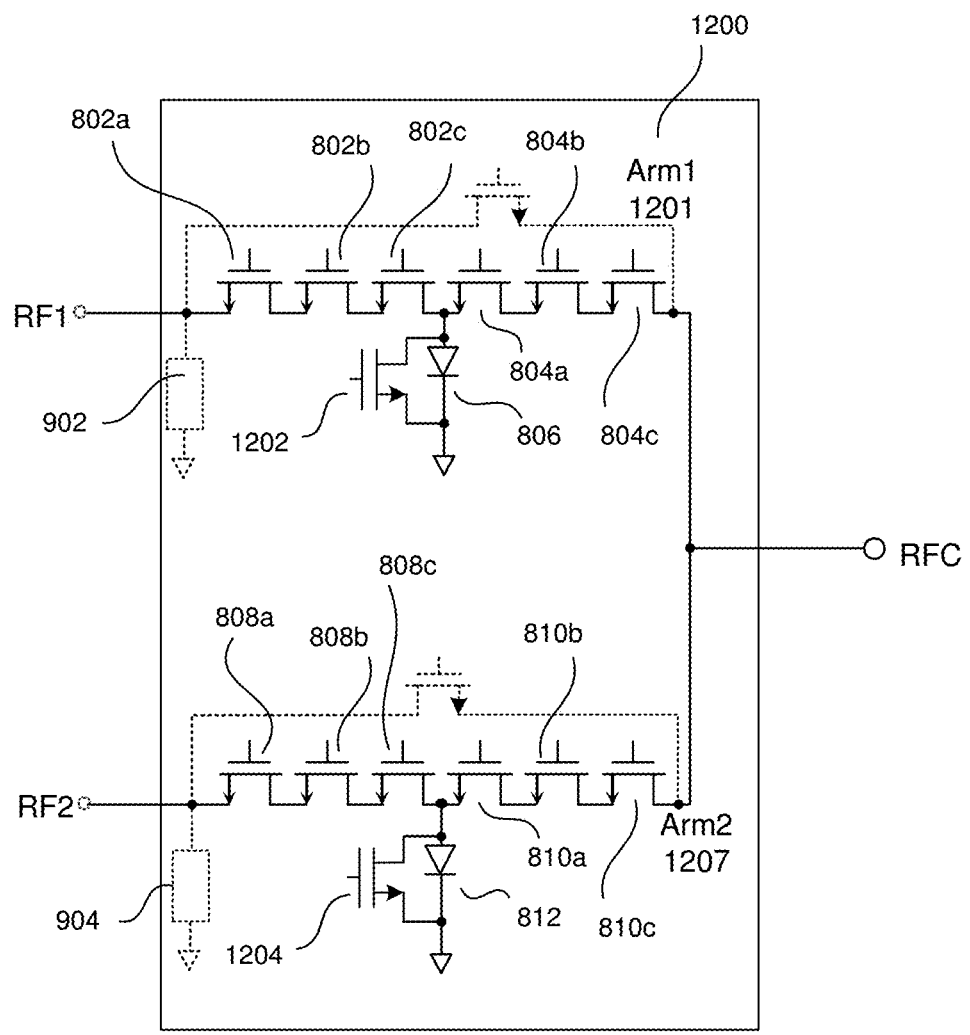
FIG. 12 is a simplified schematic of another embodiment that can be used to implement the signal selection switch.

FIG. 12 is a simplified schematic of another embodiment 1200 that can be used to implement the signal selection switch 120. The signal selection switch 1200 operates essentially like the signal selection switch 1000 described with respect to FIG. 10. However, the signal selection switch 1200 has a FET 1202 in parallel with the diode 806 and a FET 1204 in parallel with the diode 812. The FETs 1202, 1204 provide a low impedance path to ground for signals to shunt the respective diodes 806, 812 to reduce the impact of the diode on the circuits when an arm is OFF. For example, this is accomplished in the first arm 601 by turning the FET 1202 OFF when the FETs 802, 804 in the first arm 601 are ON and turning the FET 1202 ON when the FETs 802, 804 in the first arm 601 are OFF. Similarly, the FET 1204 in the second arm 607 is ON when the FETs 808, 810 in the second arm 607 are OFF and the FET 1204 is OFF when the FETs 808, 810 in the second arm 607 are ON. As in FIG. 10, any combination of one or more input shunt FET switch stacks 902, 904 and/or bypass FETs 1002, 1004 may be provided in some embodiments.

Figure 13:
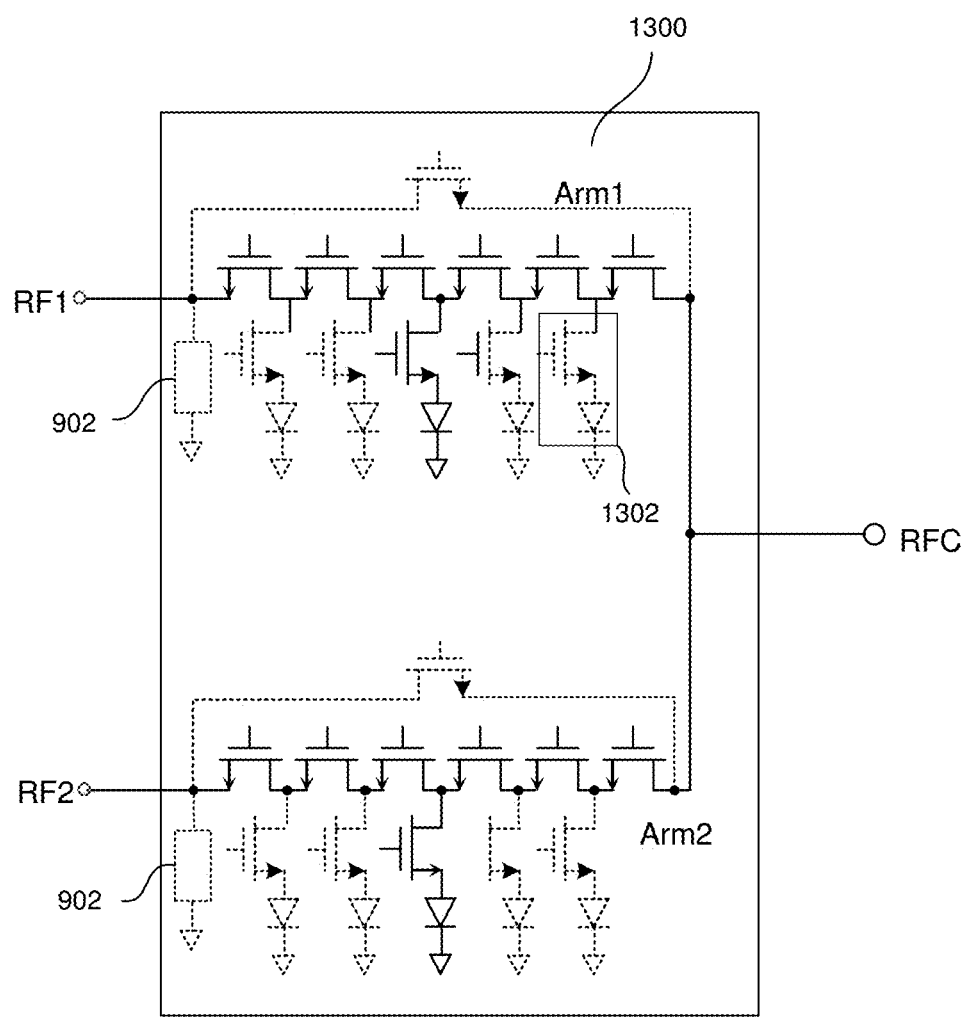
FIG. 13 is a simplified schematic of another embodiment that can be used to implement the signal selection switch.

FIG. 13 is a simplified schematic of another embodiment 1300 that can be used to implement the signal selection switch 120. The signal selection switch 1300 operates essentially like the signal selection switch 1100 shown in FIG. 11. However, additional series FET/diode pairs 1302 can be coupled between any pair of adjacent series-coupled FETs.

Providing additional FET/diode pairs 1302 allows a user to select the particular clamping voltage based on the particular FET/diode pair(s) 1302 that is/are turned ON. That is, diodes within particular FET/diode pairs can be fabricated to have different threshold voltages, or the cathodes of each can be coupled to different reference voltages. Each FET within a FET/diode pair 1302 can be independently turned ON to allow selection of the desired clamping voltage. The FET/diode pairs 1302 are shown in dotted line to indicate that any one or more such pairs 1302 can be provided. Accordingly, if only one pair 1302 is provided in a particular arm, that pair 1302 can be placed between any two adjacent pairs of the series FETs 802, 804, 808, 810. As in FIG. 10, any combination of one or more input shunt FET switch stacks 902, 904 and/or bypass FETs 1002, 1004 may be provided in some embodiments.

Figure 14:
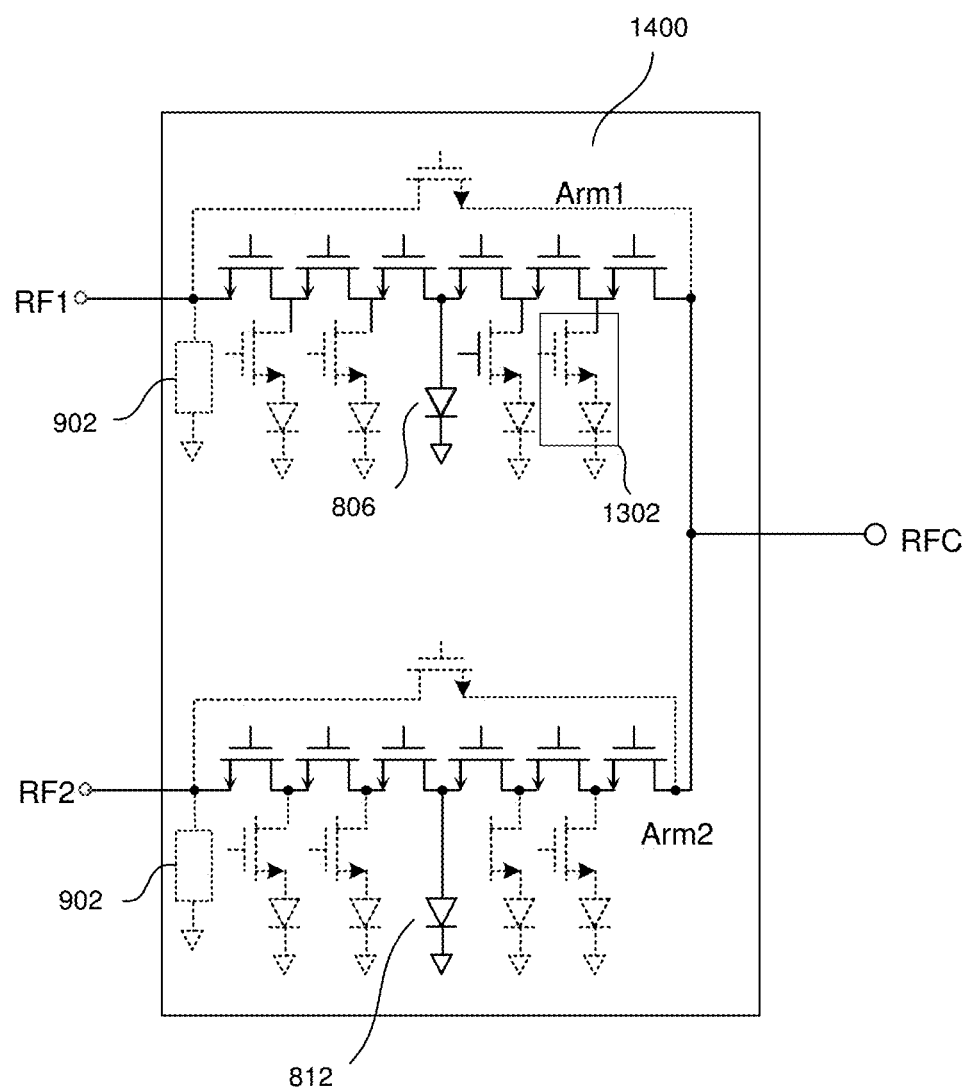
FIG. 14 is a simplified schematic of another embodiment that can be used to implement the signal selection switch.

FIG. 14 is a simplified schematic of another embodiment 1400 that can be used to implement the signal selection switch 120. The signal selection switch 1400 operates essentially like the signal selection switch 1000 shown in FIG. 10. However, the signal selection switch 1400 has FET/diode pairs 1302 similar to the signal selection switch 1300 of FIG. 13, that can be placed between any two adjacent series FETs to allow a user to select the particular clamping voltage based on the particular FET/diode pair(s) 1302 that is/are turned ON. However, in addition, at least one diode 806, 812 is provided between any two adjacent pairs of series FETS to allow minimum clamping from the diode(s) 806, 812 when each of the FETs within the FET pairs 1302 are OFF and with a selectable amount of additional clamping when one or more of the FETs of FET/diode pairs 1302 are ON.

Figure 15:
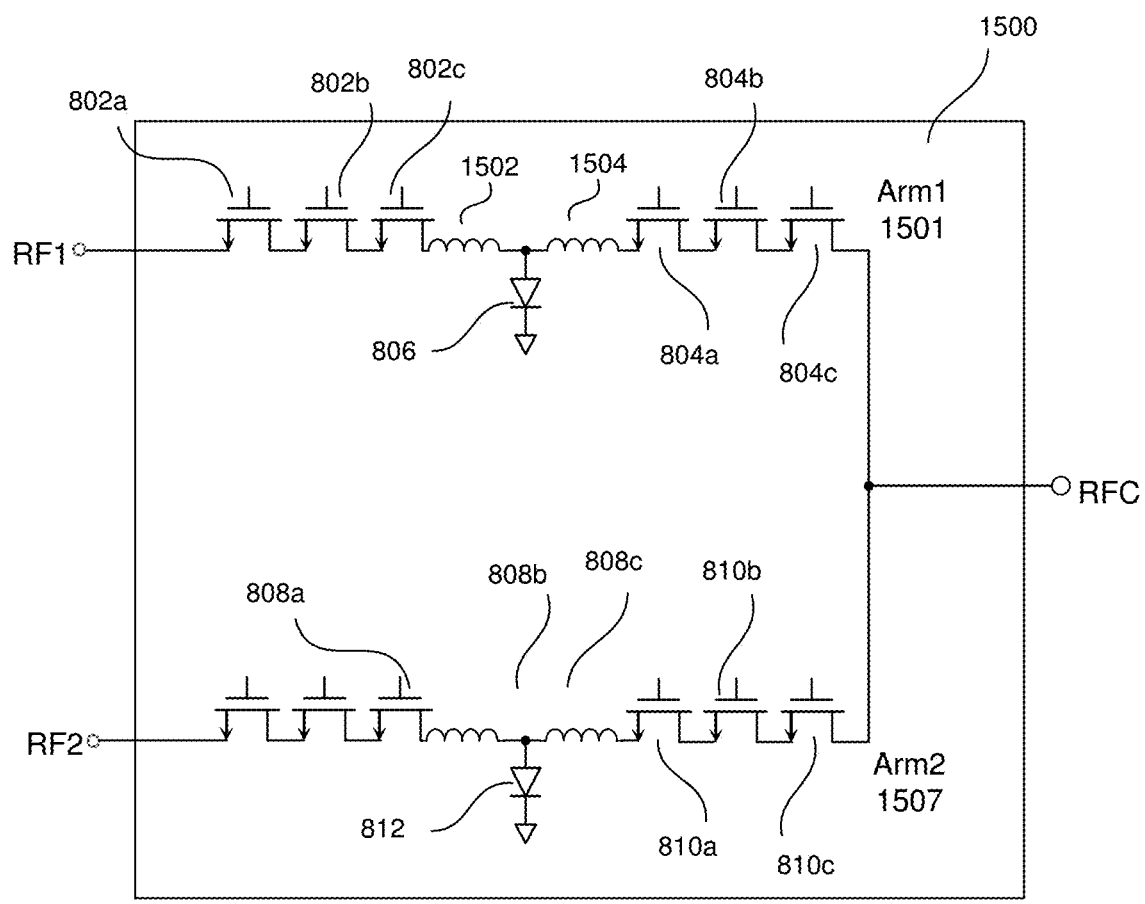
FIG. 15 is a simplified schematic of another embodiment that can be used to implement the signal selection switch.

FIG. 15 is a simplified schematic of another embodiment 1500 that can be used to implement the signal selection switch 120. The signal selection switch 1500 has a first selected inductance 1502 provided between one of the series FETs 802c and the anode of the diode 806. A second inductance 1504 is provided between another of the FETs 804a and the anode of the diode 806. Similar inductors 1506, 1508 are provided in the second arm 607, coupled to the anode of the diode 812. The amount of inductance for each inductor 1502, 1504, 1506, 1508 is selected to tune to the shunt capacitance of the corresponding diode 806, 812 when the first arm 1501 and/or the second arm 1507, respectively, is ON. Thus, the selected inductances assist in ensuring that the shunt capacitance of the signal selection switch 120 does not adversely affect the impedance at each port. In some embodiments the selected inductances may assist in ensuring that the parasitic shunt capacitances of the switch FETs 802, 804, 806 and 810 are also mitigated and do not adversely affect the impedance at each port. In some embodiments, the inductances may be provided by selecting the dimensions of the metal connections (e.g., the connection between the diode 806 and each FET 802c, 804a). While inductances 1502, 1504. 1506, 1508 are only shown in FIG. 15 for the sake of simplicity in the figures, it should be noted that they may be provided in any of the implementations of the signal selection switch 120 shown in FIG. 8 through FIG. 16.

Applications

Embodiments of the present invention may be used in a variety of devices or electronic systems that include radio frequency (RF) transceivers and/or receivers; examples include personal computers, tablet computers, wireless network components, televisions, cable system "set top" boxes, radar systems, and cellular telephones. Radio devices and systems in particularly includes wireless RF systems (including base stations, relay stations, and hand-held transceivers or receivers) that use various technologies and protocols, including various types of orthogonal frequency-division multiplexing ("OFDM"), quadrature amplitude modulation ("QAM"), Code Division Multiple Access ("CDMA"), Wide Band Code Division Multiple Access ("WCDMA"), Worldwide Interoperability for Microwave Access ("WIMAX"), Global System for Mobile Communications ("GSM"), Enhanced Data Rates for GSM Evolution (EDGE), Long Term Evolution ("LTE"), as well as other radio communication standards and protocols.

Many RF transceivers are quite complex two-way radios that transmit and receive RF signals across multiple frequencies in multiple bands using one or more signaling protocols. As an example, a modern "smartphone" may include RF transceiver circuitry capable of operating on different cellular communications systems (e.g., GSM, WCDMA, and LTE), on different wireless network frequencies and protocols (e.g., cellular frequency bands, and IEEE 802.11abgn at 2.4 GHz and 5 GHz), and on local and "personal" area networks (e.g., WiFi, Bluetooth based systems). Signal strengths of such frequencies and protocols may vary widely, requiring LNAs in some cases, and bypassing LNAs in other cases. The present invention is particularly well-suited to protect circuitry downstream from an LNA when the LNA is in a bypass configuration.

Figure 16:
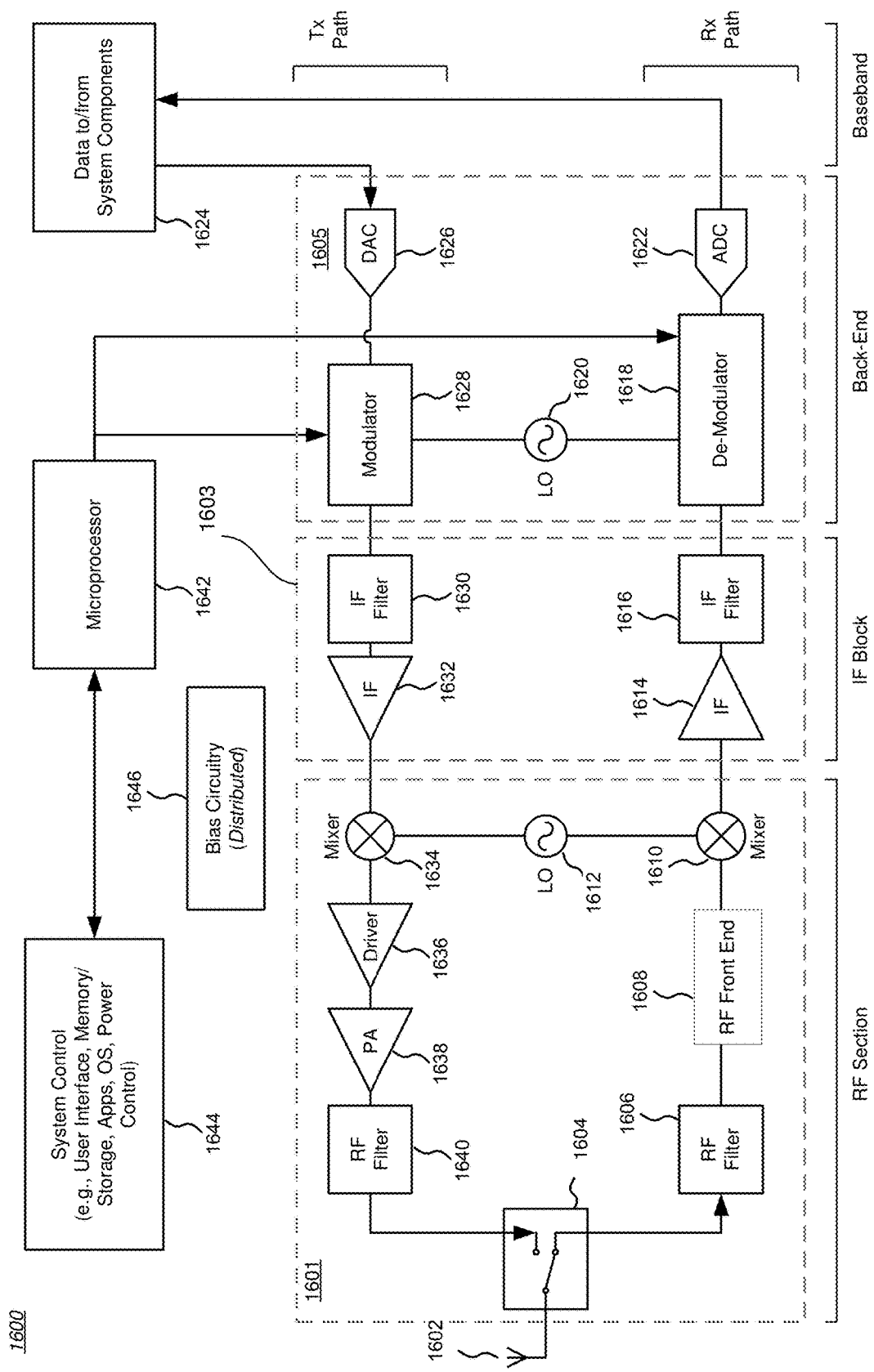
FIG. 16 is a block diagram of a transceiver that might be used in an RF device, such as a cellular telephone, and which may benefit from the use of embodiments of the disclosed front end.

FIG. 16 is a block diagram of a transceiver 1600 that might be used in an RF device, such as a cellular telephone, and which may benefit from the use of embodiments of the disclosed front end. As illustrated, the transceiver 1600 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes components in an RF Section 1601, IF Block 1603, Back-End 1605, and Baseband section 1607 (noting that in some implementations, the differentiation between sections may be different).

The receiver path Rx receives over-the-air RF signals through an antenna 1602 and a switching unit 1604, which may be implemented with active switching devices (e.g., field effect transistors or FETs), or with passive devices that implement frequency-domain multiplexing, such as a diplexer or duplexer. An RF filter 1606 passes desired received RF signals to an RF Front End 1608, the output of which is combined in a mixer 1610 with the output of a first local oscillator 1612 to produce an intermediate frequency (IF) signal. As should be clear, the RF Front End 1608 may be implemented as shown in FIG. 2A, FIG. 2B and FIG. 4. The IF signal may be amplified by an IF amplifier 1614 and subjected to an IF filter 1616 before being applied to a demodulator 1618, which may be coupled to a second local oscillator 1620. The demodulated output of the demodulator 1618 is transformed to a digital signal by an analog-to-digital converter 1622 and provided to one or more system components 1624 (e.g., a digital signal processor, a video graphics circuit, a sound circuit, memory devices, etc.). The converted digital signal may represent, for example, video or still images, sounds, or symbols, such as text or other characters.

In the illustrated example, a transmitter path Tx includes components in the Back-End 1605, IF Block 1603, and RF Section 1601 (again, in some implementations, the differentiation between sections may be different). Digital data from one or more system components 1624 is transformed to an analog signal by a digital-to-analog converter 1626, the output of which is applied to a modulator 1628, which also may be coupled to the second local oscillator 1620. The modulated output of the modulator 1628 may be subjected to an IF filter 1630 before being amplified by an IF amplifier 1632. The output of the IF amplifier 1632 is then combined in a mixer 1634 with the output of the first local oscillator 1612 to produce an RF signal. The RF signal may be amplified by a driver 1636, the output of which is applied to a power amplifier (PA) 1638. The amplified RF signal may be coupled to an RF filter 1640, the output of which is coupled to the antenna 1602 through the switching unit 1604.

The operation of the transceiver 1600 is controlled by a microprocessor 1642 in known fashion, which interacts with system control components (e.g., user interfaces, memory/storage devices, application programs, operating system software, power control, etc.). In addition, the transceiver 1600 will generally include other circuitry, such as bias circuitry 1646 (which may be distributed throughout the transceiver 1600 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1600 may be positioned in a different order (e.g., filters) or omitted. Other components can be (and usually are) added (e.g., additional filters, impedance matching networks, variable phase shifters/attenuators, power dividers, etc.).

Methods

Figure 17:
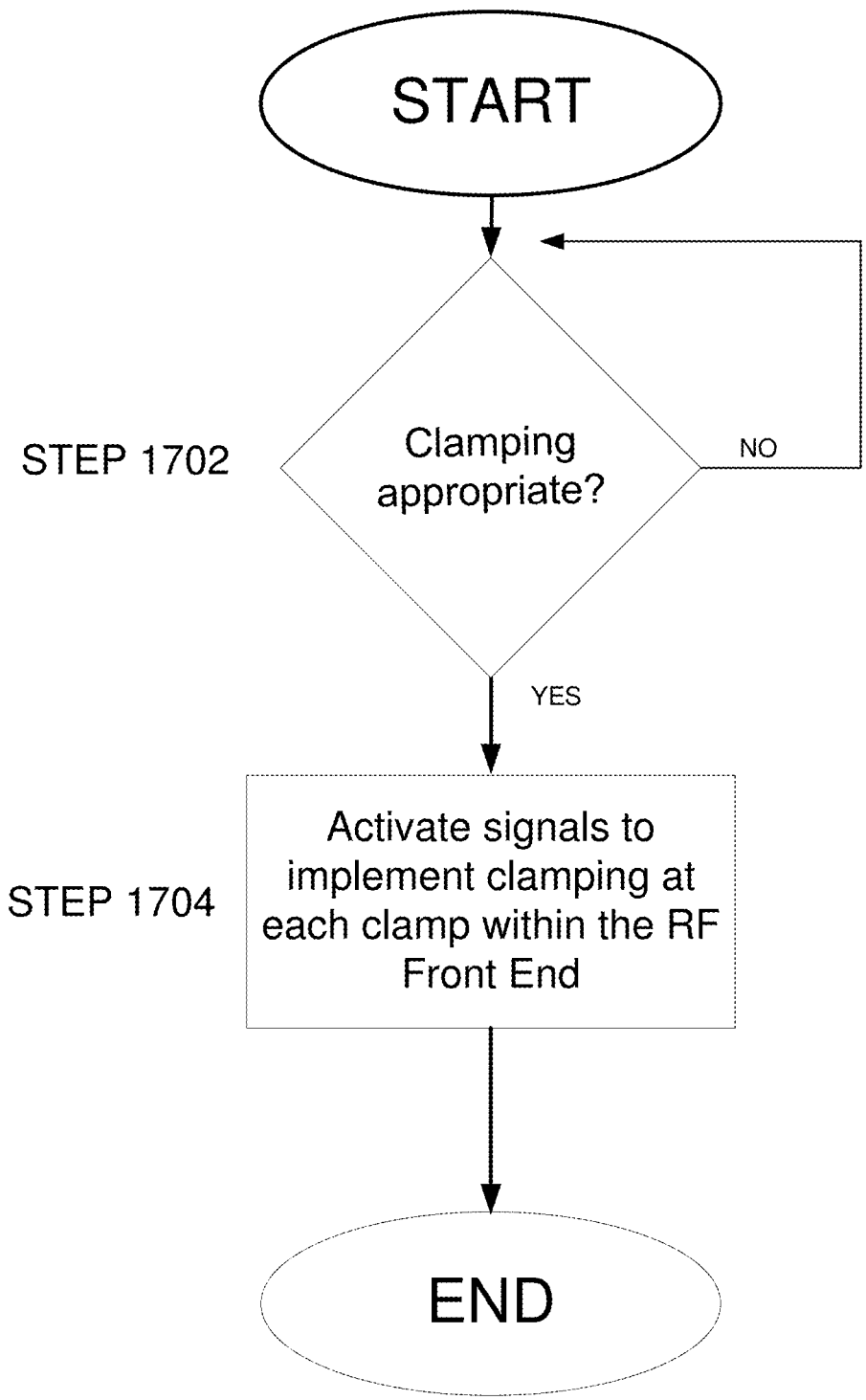
FIG. 17 illustrates the steps perform in a method for selectively clamping power on the direct gain path of an RF Front End.

Also disclosed are methods for selectively clamping power on the direct gain path 104 of an RF Front End, on the attenuated path 106 of the RF Front End, on the bypass path of the RF Front End and at the output of the RF Front End, as shown in FIG. 4. FIG. 17 illustrates the steps performed in such a method. In one embodiment, a determination is made whether clamping is desired (e.g., needed to protect the circuits from an over voltage condition) (STEP 1702). In some embodiments, the desired levels to which the signal is clamped are set may be determined "on the fly" based upon actual signals received, bands of operation, geographic location, etc. In other embodiments, the levels to which the signal are clamped are set by the factory based upon the hardware used in the receiver. If desired, each of the clamping circuits is activated (STEP 1704).

Figure 18:
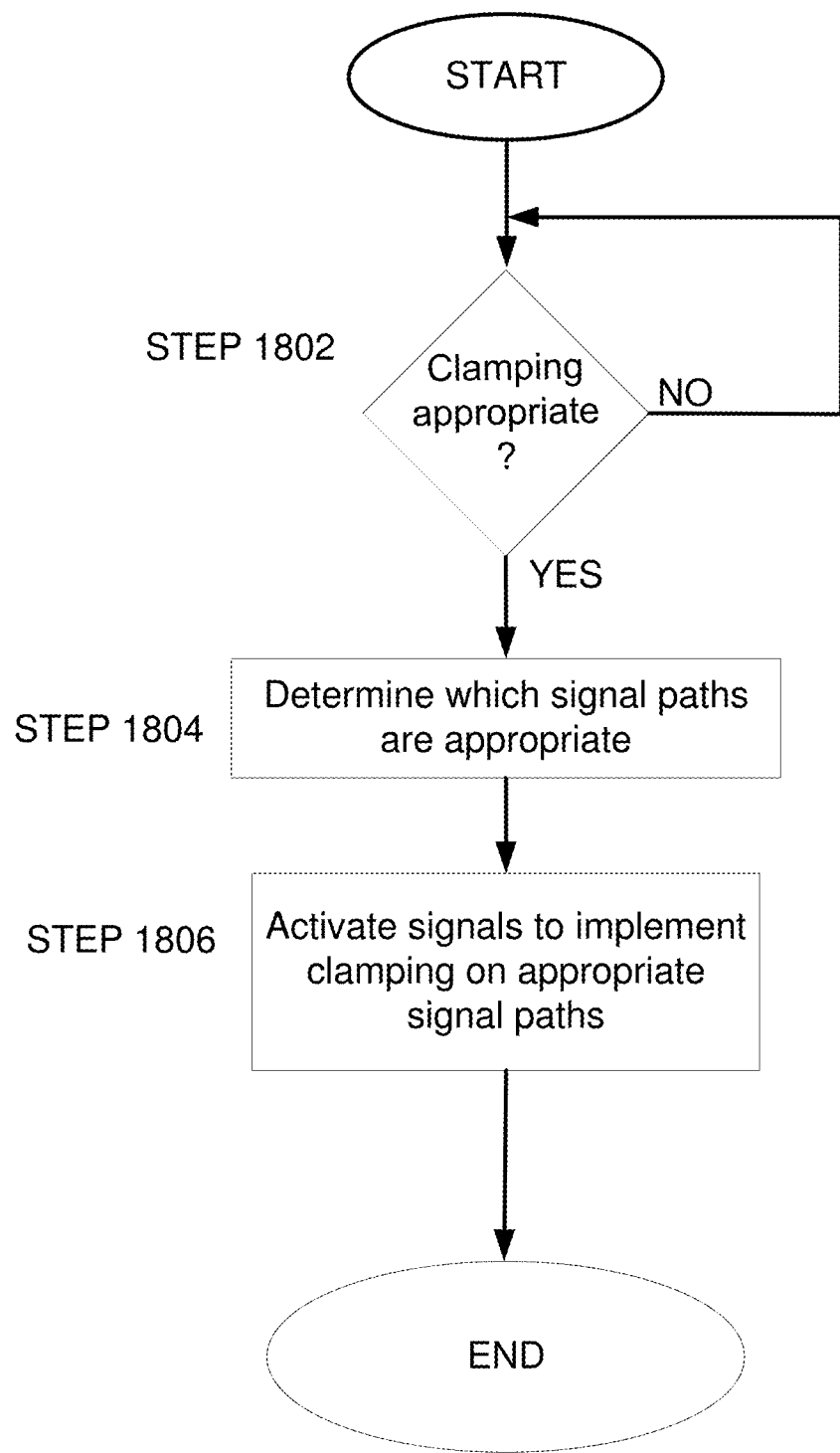
FIG. 18 illustrates the steps of a method in accordance with another embodiment for selectively clamping power on the direct gain path of an RF Front End.

FIG. 18 illustrates the steps of a method in accordance with another embodiment. Initially, a determination is made as to whether clamping is desired. The level to which the signal is clamped is as noted above with respect to the method shown in FIG. 17 (STEP 1802). If not desired, no action is taken until clamping is desired. Next, a determination is made as to which signal paths require clamping (STEP 1804). Clamping circuits in those signal paths for which clamping is desired are then activated (STEP 1806). That is, in the front end 400 shown in FIG. 4, a signal requiring clamping may flow through either the direct gain path 104 or the attenuated path 106. Furthermore, if the signal flows through the attenuated path 106, it may be routed by the switch 124 to either the attenuated gain path 125 or the bypass path 127.

Fabrication Technologies & Options

As used in this specification, the term "radio frequency" (RF) refers a rate of oscillation in the range of about 3 kHz to about 300 GHz. This term also includes the frequencies used in wireless communication systems. An RF frequency may be the frequency of an electromagnetic wave or of an alternating voltage or current in a circuit.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

Circuits and devices in accordance with the present invention may be used alone or in combination with other components, circuits, and devices. Embodiments of the present invention may be fabricated in whole or in party as integrated circuits (ICs), which may be encased in IC packages and/or or modules for ease of handling, manufacture, and/or improved performance.

As should be readily apparent to one of ordinary skill in the art, various embodiments of the invention can be implemented to meet a wide variety of specifications. The inductors and/or capacitors in the various embodiments may be fabricated on an IC "chip", or external to such a chip and coupled to the chip in known fashion. The values for the inductors and capacitors generally will be determined by the specifications for a particular application, taking into account such factors as RF frequency bands, the natural limiting voltage of the clamping circuit, system requirements for saturated output power and expected level of large input signals, etc.

Unless otherwise noted above, selection of suitable component values is a matter of design choice and various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, Indium Phosphide HEMT (InP HEMT) and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies above about 1 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Conclusion

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A clamping circuit including:
   (a) an input;
   (b) an output;
   (c) a reference potential port;
   (d) a bypass switch coupled between the input and the output;
   (e) a signal path coupled in series between the input and the output and in parallel with the bypass switch, the signal path including a first signal path switch and a second signal path switch coupled in series; and
   (f) a clamping device coupled between a node between the first and the second signal path switches and the reference potential port.

2. The clamping circuit of claim 1, wherein the clamping device includes at least one diode.

3. The clamping circuit of claim 1, wherein the clamping device includes at least one MOSFET configured as a diode.

4. The clamping circuit of claim 1, wherein the clamping device includes at least one pair of anti-parallel diodes.

5. The clamping circuit of claim 1, wherein at least one of the bypass switch, the first signal path switch, and the second signal path switch is a MOSFET.

6. The clamping circuit of claim 1, wherein the reference potential port is configured to be coupled to a ground potential.

7. The clamping circuit of claim 1, wherein the reference potential port is configured to be coupled to a reference potential other than ground.

8. The clamping circuit of claim 1, wherein the clamping circuit is selectively set to a bypass mode or to a clamping mode.

9. The clamping circuit of claim 1, wherein the clamping circuit is set to a clamping mode when a voltage applied to the input exceeds a selected power level.

10. The clamping circuit of claim 1, wherein the clamping circuit is set to a bypass mode when a voltage applied to the input is less than a selected power level.

11. The clamping circuit of claim 1, wherein the clamping circuit is set to a clamping mode when a voltage applied to the input exceeds a selected power level and is set to a bypass mode when a voltage applied to the input is less than a selected power level.

12. The clamping circuit of claim 1, wherein the bypass switch is configured to be set to a closed state and the first and second signal path switches are configured to be set to an open state, thereby allowing a voltage applied to the input to pass essentially undiminished to the output, bypassing the signal path.

13. The clamping circuit of claim 1, wherein the bypass switch is configured to be set to an open state and the first and second signal path switches are configured to be set to a closed state, thereby clamping a voltage applied to the input at a selected voltage level.

14. The clamping circuit of claim 1, wherein when the bypass switch is set to a closed state and the first and second signal path switches are set to an open state, a voltage applied to the input passes essentially undiminished to the output, bypassing the signal path, and when the bypass switch is set to an open state and the first and second signal path switches are set to a closed state, a voltage applied to the input is clamped.

15. The clamping circuit of claim 1, wherein the input and the output are configured to be coupled in parallel with an amplifier.

* * * * *